United States Patent
Shimabukuro et al.

(10) Patent No.: US 9,419,012 B1
(45) Date of Patent: Aug. 16, 2016

(54) THREE-DIMENSIONAL MEMORY STRUCTURE EMPLOYING AIR GAP ISOLATION

(71) Applicant: SANDISK TECHNOLOGIES, INC., Plano, TX (US)

(72) Inventors: Seiji Shimabukuro, Yokkaichi (JP); Tomoyuki Obu, Yokkaichi (JP); Ryusuke Mikami, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/744,322

(22) Filed: Jun. 19, 2015

(51) Int. Cl.
*H01L 27/115* (2006.01)
*H01L 21/768* (2006.01)
(Continued)

(52) U.S. Cl.
CPC .... *H01L 27/11582* (2013.01); *H01L 21/28273* (2013.01); *H01L 21/28282* (2013.01); *H01L 21/31111* (2013.01); *H01L 21/32133* (2013.01); *H01L 21/764* (2013.01); *H01L 21/7682* (2013.01); *H01L 21/76801* (2013.01); *H01L 21/76802* (2013.01); *H01L 21/76877* (2013.01); *H01L 23/528* (2013.01); *H01L 23/5226* (2013.01); *H01L 27/11521* (2013.01); *H01L 27/11551* (2013.01); *H01L 27/11556* (2013.01); *H01L 27/11568* (2013.01); *H01L 27/11578* (2013.01); *H01L 29/04* (2013.01); *H01L 29/16* (2013.01); *H01L 29/4234* (2013.01); *H01L 29/42324* (2013.01); *H01L 29/66825* (2013.01); *H01L 29/66833* (2013.01); *H01L 29/788* (2013.01); *H01L 29/7889* (2013.01); *H01L 29/7926* (2013.01)

(58) Field of Classification Search
None
See application file for complete search history.

(56) References Cited

U.S. PATENT DOCUMENTS 5,084,417 A  1/1992  Joshi et al.
5,807,788 A  9/1998  Brodsky et al.
(Continued)

FOREIGN PATENT DOCUMENTS

JP  2013-235978  11/2013
WO  WO 02/15277 A2  2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Minh-Loan Tran
(74) *Attorney, Agent, or Firm* — The Marbury Law Group PLLC

(57) ABSTRACT

Electrically conductive layers for control gate electrodes of a vertical memory device can be vertically spaced by cavities to reduce capacitive coupling between neighboring electrically conductive gate electrodes. An alternating stack of first material layers and second material layers can be provided. After replacing the second material layers with electrically conductive layers, the first material layers can be removed to form cavities between the electrically conductive layers. A dielectric material can be deposited with high anisotropic deposition rate to form an insulating spacer. For example, a plasma assisted atomic layer deposition process can be employed to deposit a dielectric spacer that include laterally protruding portions that encapsulate the cavities at each level between neighboring pairs of electrically conductive layers. A contact via structure can be formed in the insulating spacer to provide electrical contact to a source region.

14 Claims, 15 Drawing Sheets

(51) Int. Cl.
  *H01L 29/16*   (2006.01)
  *H01L 29/04*   (2006.01)
  *H01L 21/311*  (2006.01)
  *H01L 29/792*  (2006.01)
  *H01L 29/788*  (2006.01)
  *H01L 23/522*  (2006.01)
  *H01L 29/423*  (2006.01)
  *H01L 21/28*   (2006.01)
  *H01L 23/528*  (2006.01)
  *H01L 21/3213* (2006.01)
  *H01L 21/764*  (2006.01)
  *H01L 29/66*   (2006.01)

(56) References Cited

U.S. PATENT DOCUMENTS

| | | | |
|---|---|---|---|
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 8,658,499 | B2 | 2/2014 | Makala et al. |
| 8,884,357 | B2 | 11/2014 | Wang et al. |
| 8,933,501 | B2 | 1/2015 | Makala et al. |
| 8,987,087 | B2 | 3/2015 | Chien et al. |
| 8,987,089 | B1 | 3/2015 | Pachamuthu et al. |
| 9,023,719 | B2 | 5/2015 | Pachamuthu et al. |
| 9,263,596 | B2 * | 2/2016 | Yoo .................. H01L 29/792 |
| 2007/0210338 | A1 | 9/2007 | Orlowski |
| 2007/0252201 | A1 | 11/2007 | Kito et al. |
| 2009/0242967 | A1 | 10/2009 | Katsumata et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0199833 | A1 * | 8/2011 | Shim .................. G11C 16/0483 365/185.23 |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0092926 | A1 | 4/2012 | Whang et al. |
| 2012/0146122 | A1 | 6/2012 | Whang et al. |
| 2012/0256247 | A1 | 10/2012 | Alsmeier |
| 2013/0083601 | A1 * | 4/2013 | Liu .................. H01L 27/11521 365/185.17 |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |
| 2014/0225181 | A1 | 8/2014 | Makala et al. |
| 2015/0008505 | A1 | 1/2015 | Chien et al. |
| 2015/0076584 | A1 | 3/2015 | Pachamuthu et al. |
| 2015/0076585 | A1 | 3/2015 | Pachamuthu et al. |
| 2015/0079742 | A1 | 3/2015 | Pachamuthu et al. |
| 2015/0318299 | A1 * | 11/2015 | Lai .................. H01L 27/11582 257/325 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M. "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/News_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

International Search Report and Written Opinion received in connection with international application No. PCT/US2013/048508; mailed Dec. 18, 2013.

Chen Y. T. et al., "Formation of $NiSi_2/SiN_x$ Compound Nanocrystal for Nonvolatile Memory Application", Thin Solid Films, Elsevier-Sequoia S.A., Lausanne, Switzerland, vol. 518, No. 24, pp. 7324-7327 (2010).

U.S. Appl. No. 14/133,979, filed Dec. 19, 2013, SanDisk Technologies Inc.

U.S. Appl. No. 14/319,283, filed Jun. 30, 2014, SanDisk Technologies Inc.

U.S. Appl. No. 14/326,298, filed Jul. 8, 2014, SanDisk Technologies Inc.

U.S. Appl. No. 14/456,496, filed Aug. 11, 2014, SanDisk Technologies Inc.

U.S. Appl. No. 14/456,515, filed Aug. 11, 2014, SanDisk Technologies Inc.

U.S. Appl. No. 14/468,650, filed Aug. 26, 2014, SanDisk Technologies Inc.

* cited by examiner

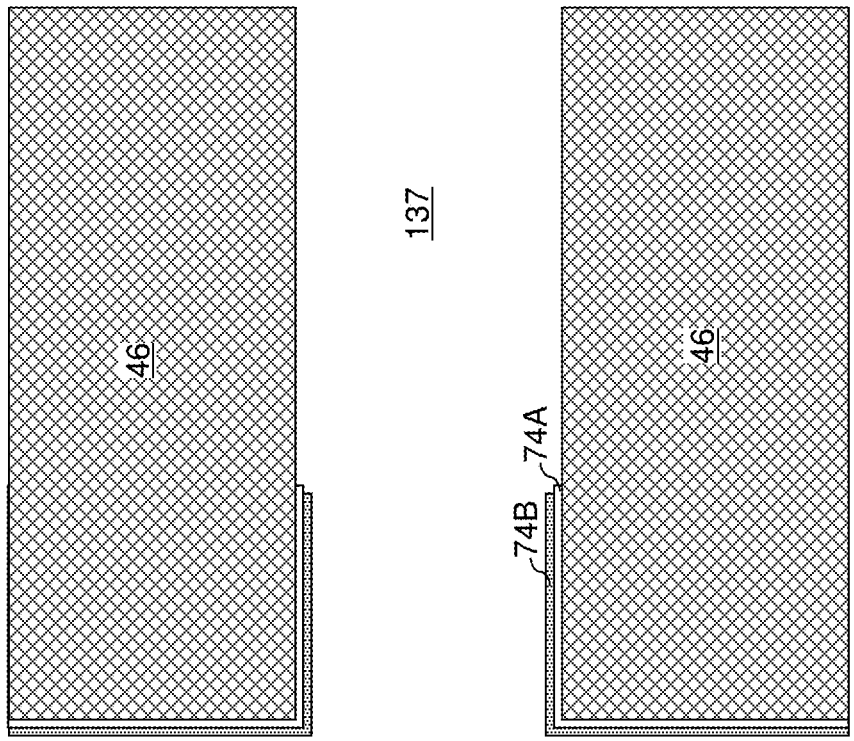

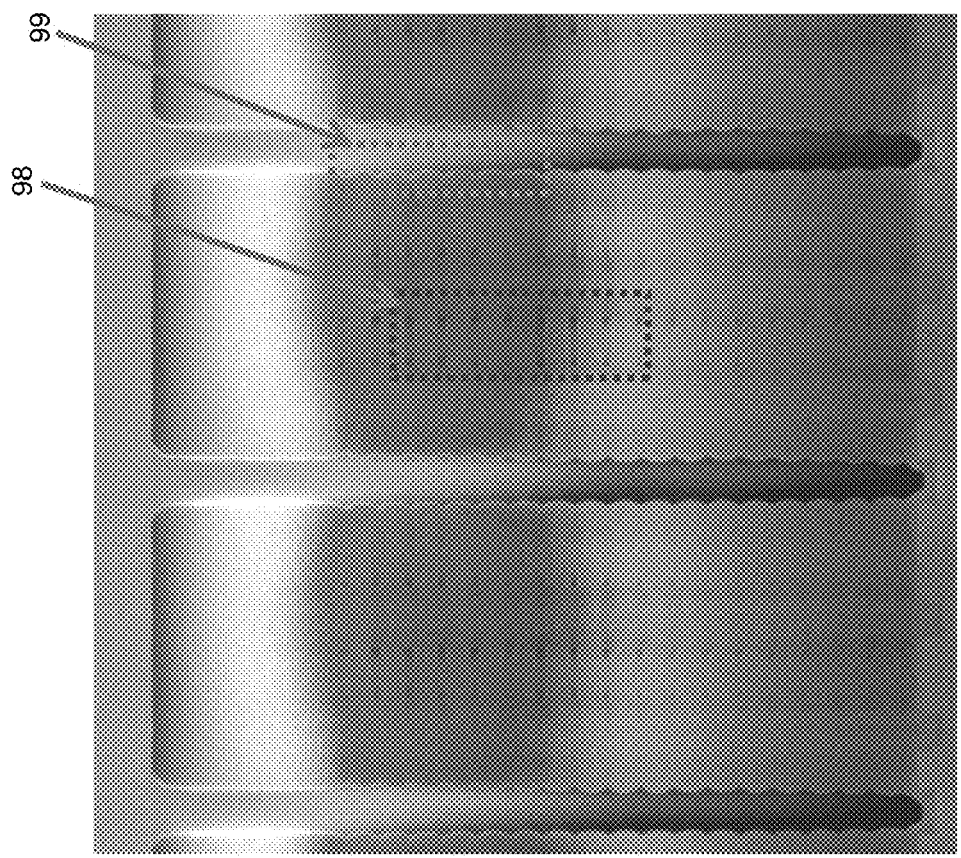
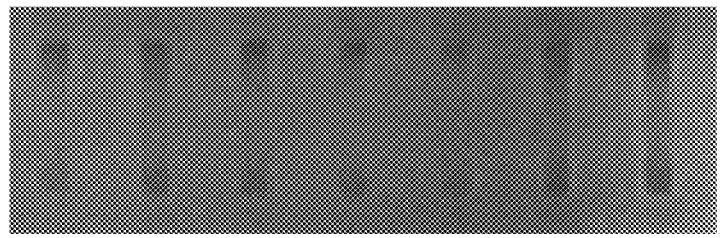
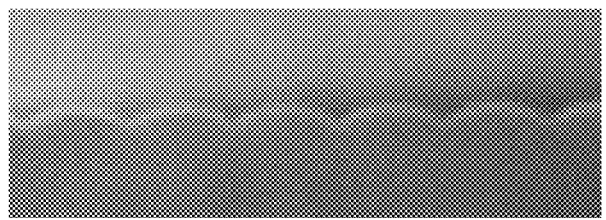
FIG. 14A
FIG. 14B
FIG. 14C

THREE-DIMENSIONAL MEMORY STRUCTURE EMPLOYING AIR GAP ISOLATION

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of manufacturing a device is provided. A stack of alternating layers comprising first material layers and second material layers is formed over a substrate. A plurality of memory stack structures is formed through the stack of alternating layers. A trench is formed through the stack of alternating layers. The second material layers are replaced with electrically conductive materials to form electrically conductive layers. The first material layers are removed selective to the electrically conductive layers. A dielectric material is deposited over a sidewall of the trench and first portions of the horizontal surfaces of the electrically conductive layers that are proximal to the trench to form a contiguous dielectric material layer while not depositing the dielectric material over second portions of the horizontal surfaces of the electrically conductive layers that are more distal from the trench than the first portions. An insulating spacer is formed in the trench by anisotropically etching the contiguous dielectric material layer. A backside contact via structure is formed within the insulating spacer.

According to another aspect of the present disclosure, a monolithic three-dimensional memory device is provided, which comprises a plurality of electrically conductive layers vertically spaced apart by cavities that are present between each vertically neighboring pair of electrically conductive layers. Each of the electrically conductive layers is mechanically supported by a plurality of memory stack structures extending through the alternating stack and located over a substrate. The monolithic three-dimensional memory device further comprises a backside contact trench extending through the plurality of electrically conductive layers and each level of the cavities; and an insulating spacer located along a periphery of the backside contact trench and comprising laterally protruding portions that protrude outward from a vertical plane including an interface between the insulating spacer and the electrically conductive layers. Each laterally protruding portion is located between a respective vertically neighboring pair of electrically conductive layers and has a non-planar sidewall that defines a boundary of a respective cavity, and each laterally protruding portion comprises an upper protruding region extending toward one of the pair of electrically conductive layers and a lower protruding region extending toward the other one of the pair of electrically conductive layer and a trough located between the upper and lower protruding regions. A backside contact via structure is located within the insulating spacer and is electrically shorted to a portion of the substrate.

BRIEF DESCRIPTION OF THE DRAWINGS

FIG. 10A is a vertical cross-sectional view of a portion of the exemplary structure during an atomic layer deposition process according to an embodiment of the present disclosure.

FIG. 14A is an electron microscope image of an exemplary device according to an embodiment of the present disclosure. FIGS. 14B and 14C are close up electron microscope images of regions 98 and 99 in FIG. 14A, respectively.

DETAILED DESCRIPTION

Figure 1:
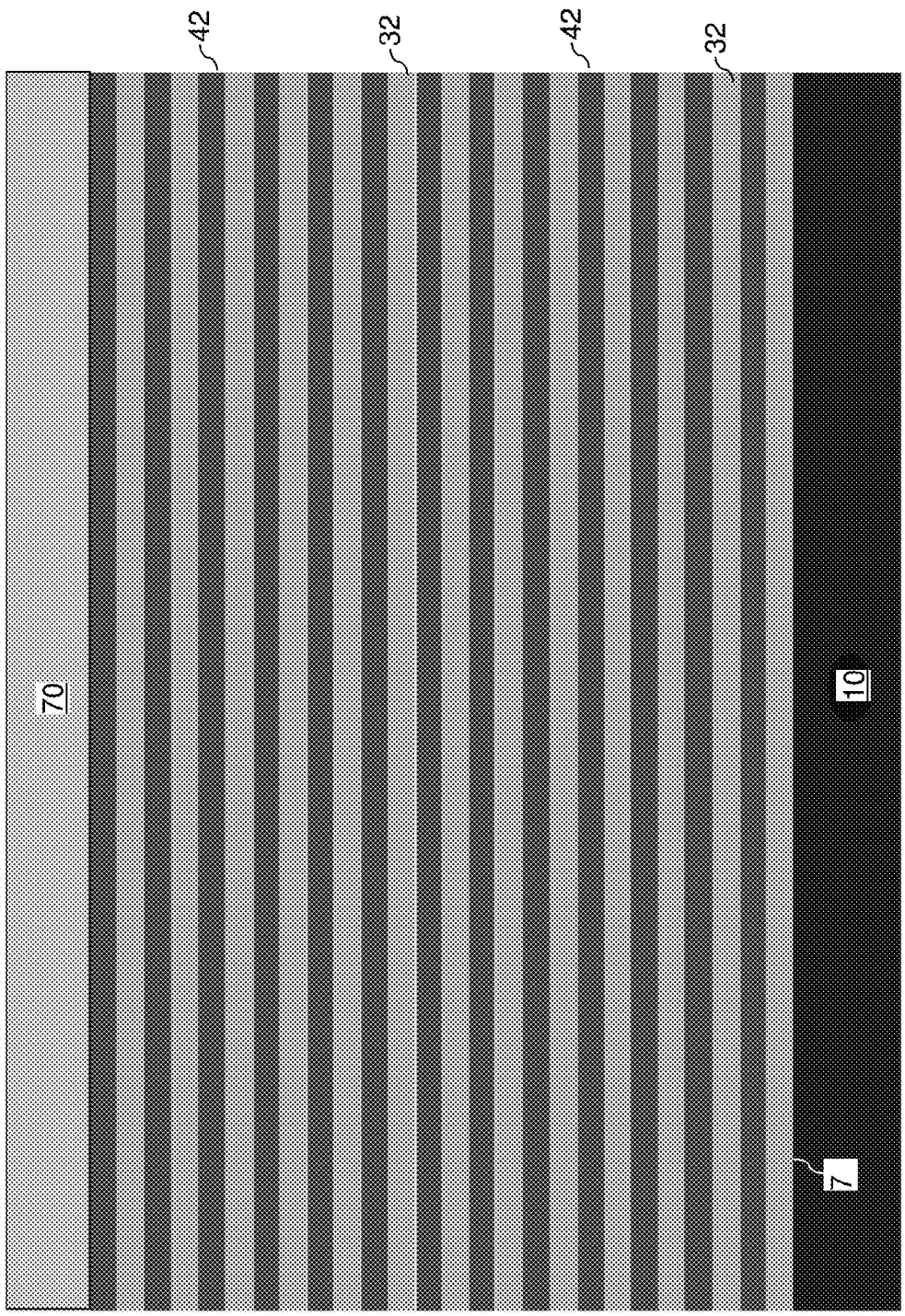
FIG. 1 is a vertical cross-sectional view of an exemplary structure after formation of an alternating stack of first material layers and second material layers and an insulating cap layer according to an embodiment of the present disclosure.

As discussed above, the present disclosure is directed to field of semiconductor devices and specifically to three-dimensional memory structures, such as vertical NAND strings and other three-dimensional devices, and methods of making thereof, the various aspects of which are described below. The embodiments of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, or may have one or more layer thereupon, thereabove, and/or therebelow. A plane or surface is horizontal when it is parallel to a flat portion of the top surface of the substrate. However, it should be understood that the substrate may be positioned at any angle with respect to the direction of gravity and that the term "horizontal" does not imply that a horizontal direction must be perpendicular to the direction of gravity. Likewise, the term "vertical" means perpendicular to the flat portion of the tG2op surface of the substrate and does not imply that a vertical direction must be parallel to (or directed 180 degrees from) the direction of gravity A layer may extend horizontally, vertically, and/or along a tapered surface.

A monolithic three-dimensional memory array is an array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to a first embodiment of the present disclosure is illustrated, which can be employed, for example, to fabricate a device structure containing vertical NAND memory devices. The exemplary structure includes a substrate, which can be a single crystalline semiconductor substrate. The substrate can include a semiconductor material layer 10. The semiconductor material layer 10 can be a single crystalline semiconductor material layer located in the substrate, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the semiconductor material layer 10. The major surface 7 can be a semiconductor surface. In one embodiment, the major surface 7 can be a single crystalline semiconductor surface. In one embodiment, the semiconductor material layer 10 can be a doped well (such as a p-doped well) formed by implantation of electrical dopants. In case the first semiconductor layer 10 comprises a doped semiconductor material, the conductivity type of the first semiconductor layer 10 is herein referred to as a first conductivity type.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. A material is "semiconducting" if the electrical conductivity is in a range from $1.0 \times 10^{-6}$ S/cm to $1.0 \times 10^{5}$ S/cm. All measurements for electrical conductivities are made at the standard condition.

At least one semiconductor device (not shown) for a peripheral circuitry can be formed on a portion of the semiconductor material layer 10. Optionally, the portion of the semiconductor material layer 10 may be recessed prior to formation of the at least one semiconductor device, or an epitaxial semiconductor material pedestal (not shown) may be formed prior to formation of the at least semiconductor device thereupon. The at least one semiconductor device can include, for example, field effect transistors. The least one semiconductor device for the peripheral circuitry can contain a driver circuit for memory devices to be subsequently formed, which can include at least one NAND device.

A stack of an alternating plurality of first material layers (which can be first sacrificial material layers 32) and second material layers (which can be second sacrificial material layers 42) is formed over the top surface of the substrate. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, the first material layers and the second material layers comprise a pair of different materials selected from silicon oxide (which may be a high etch rate silicon oxide such as borosilicate glass or phosphosilicate glass or a porous silicon oxide or an organosilicate glass), silicon nitride, an amorphous or polycrystalline semiconductor material, and a carbon material (such as amorphous carbon or diamond-like carbon). In one embodiment, each first material layer can be a first sacrificial material layer 32, and each second material layer can be a second sacrificial material layer 42. In this case, the stack can include an alternating plurality of first sacrificial material layers 32 and second sacrificial material layers 42, and constitutes a prototype stack of alternating layers comprising first sacrificial material layers 32 and second sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include first sacrificial material layers 32 composed of the first material, and second sacrificial material layers 42 composed of a second material different from that of first sacrificial material layers 32. The first material of the first sacrificial material layers 32 can be at least one insulating material. As such, each first sacrificial material layer 32 can be an insulating material layer. Insulating materials that can be employed for the first sacrificial material layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first sacrificial material layers 32 can be silicon oxide.

The second material of the second sacrificial material layers 42 is a sacrificial material that can be removed selective to the first material of the first sacrificial material layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second sacrificial material layers 42 may comprise an insulating material, a semiconductor material, or a conductive material. The second material of the second sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the second sacrificial material layers 42 can be spacer material layers that comprise silicon nitride or a semiconductor material including at least one of silicon and germanium.

In one embodiment, the first sacrificial material layers 32 can include silicon oxide, and sacrificial material layers can include silicon nitride sacrificial material layers. The first material of the first sacrificial material layers 32 can be deposited, for example, by chemical vapor deposition (CVD). For example, if silicon oxide is employed for the first sacrificial material layers 32, tetraethyl orthosilicate (TEOS) can be employed as the precursor material for the CVD process. The second material of the second sacrificial material layers 42 can be formed, for example, CVD or atomic layer deposition (ALD).

The second sacrificial material layers 42 can be suitably patterned so that conductive material portions to be subsequently formed by replacement of the second sacrificial material layers 42 can function as electrically conductive electrodes, such as the control gate electrodes of the monolithic three-dimensional NAND string memory devices to be subsequently formed. The second sacrificial material layers 42 may comprise a portion having a strip shape extending substantially parallel to the major surface 7 of the substrate.

The thicknesses of the first sacrificial material layers 32 and the second sacrificial material layers 42 can be in a range from 20 nm to 50 nm, although lesser and greater thicknesses can be employed for each first sacrificial material layer 32 and for each second sacrificial material layer 42. The number of repetitions of the pairs of an first sacrificial material layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each second sacrificial material layer 42 in the alternating stack (32, 42) can have a uniform thickness that is substantially invariant within each respective second sacrificial material layer 42.

Optionally, an insulating cap layer 70 can be formed over the alternating stack (32, 42). The insulating cap layer 70 includes a dielectric material that is different from the material of the second sacrificial material layers 42. In one embodiment, the insulating cap layer 70 can include a dielectric material that can be employed for the first sacrificial material layers 32 as described above. The insulating cap layer 70 can have a greater thickness than each of the first sacrificial material layers 32. The insulating cap layer 70 can be deposited, for example, by chemical vapor deposition. In one embodiment, the insulating cap layer 70 can be a silicon oxide layer.

Figure 2:
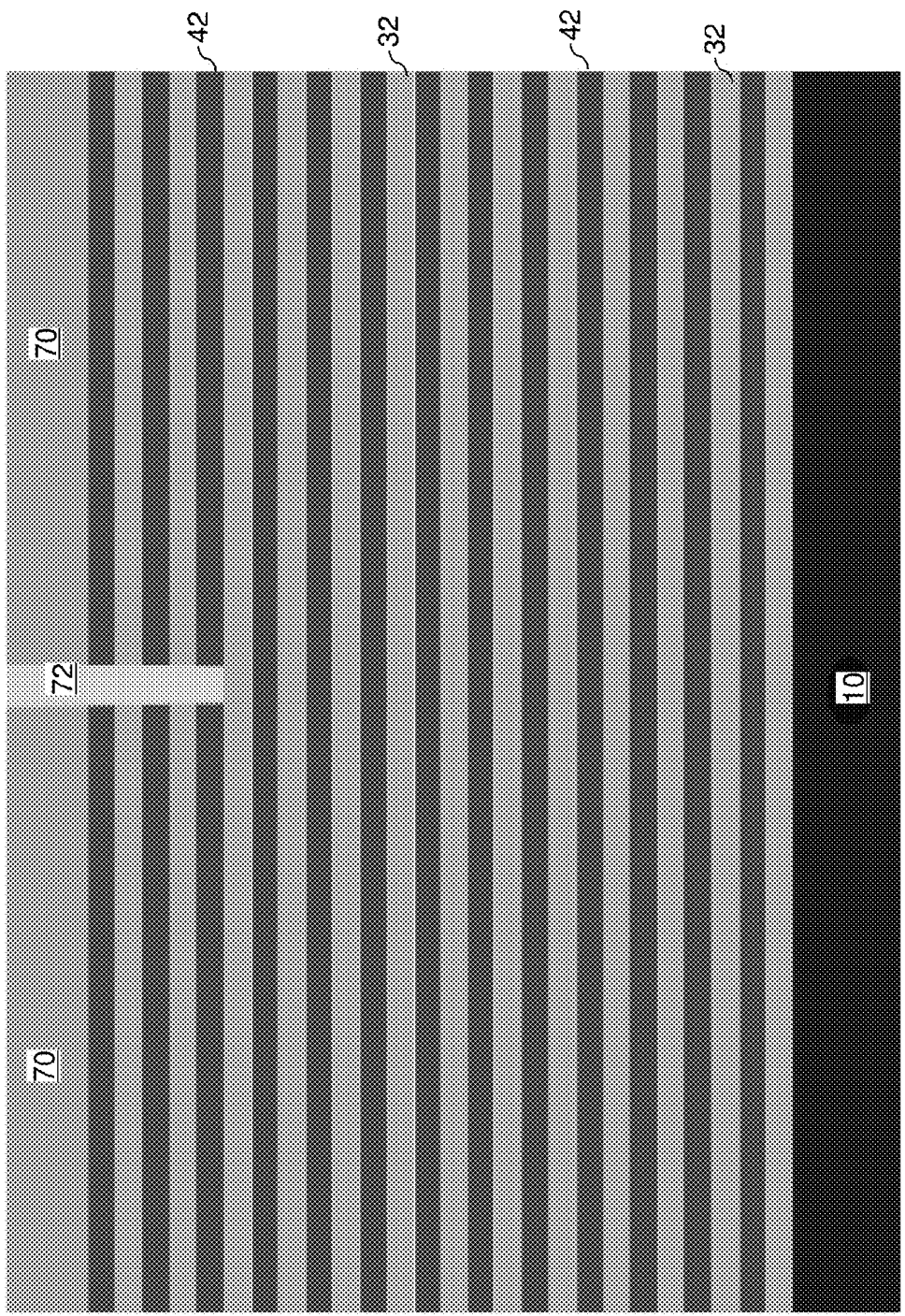
FIG. 2 is vertical cross-sectional view of the exemplary structure after formation of an isolation insulator structure according to an embodiment of the present disclosure.

Referring to FIG. 2, an isolation insulator structure 72 can be formed through the insulating cap layer 70 and a set of first and second sacrificial material layers (32, 42) located in a top portion of the alternating stack (32, 42). For example, a trench can be formed by application and patterning of a photoresist layer over the insulating cap layer 70, and subsequent transfer of the pattern in the photoresist layer through the insulating cap layer 70 and upper layers of the alternating stack (32, 42) employing an anisotropic etch. The photoresist layer can be removed, for example, by ashing. In one embodiment, the trench can be formed in regions halfway between regions in which a neighboring pair of backside contact trenches (which can be slit trenches) is to be subsequently formed. In this case, the trenches formed through the insulating cap layer 70 and the set of first and second sacrificial material layers (32, 42) can divide the set of first and second sacrificial material layers (32, 42) into two mutually physically disjoined stacks, and is referred to as a "slit half trench."

A dielectric fill material such as silicon oxide, silicon nitride, or a dielectric metal oxide can be deposited in the trench to completely fill the trench. The dielectric fill material is a material different from the first and second materials of the first and second sacrificial material layers (32, 42). For example, if the first sacrificial material layers 32 comprise silicon oxide and if the second sacrificial material layers 42 comprise silicon nitride, a dielectric metal oxide such as aluminum oxide can be employed as the dielectric fill material. The portion of the dielectric fill material above the top surface of the insulating cap layer 70 can be removed by a planarization process, which can employ a recess etch and/or a chemical mechanical planarization (CMP) process. The remaining portion of the dielectric fill material is an isolation insulator structure 72. The isolation insulator structure 72 can be employed to provide electrical isolation between laterally spaced portions of electrically conductive layers to be subsequently formed at each level of the second sacrificial material layers 42 through which the isolation insulator structure 72 extends. In one embodiment, drain select gate electrodes can be subsequently formed at the levels of the second sacrificial material layers 42 through which the isolation insulator structure 72 extends.

Figure 3:
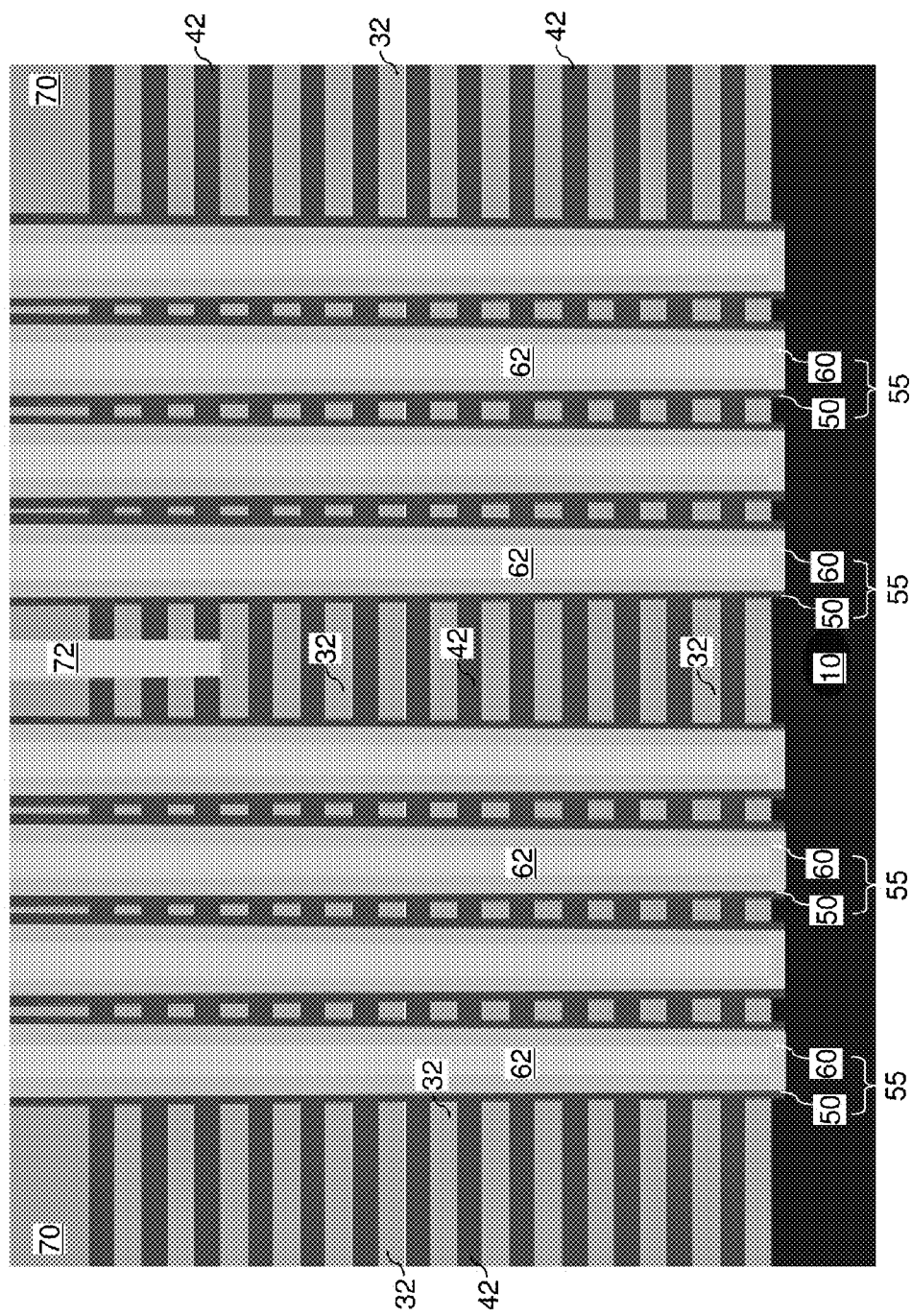
FIG. 3 is a vertical cross-sectional view of the exemplary structure after formation of memory stack structures according to an embodiment of the present disclosure.

Referring to FIG. 3, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings that extend to the top surface of the semiconductor material layer 10. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings can be substantially vertical, or can be tapered. The patterned lithographic material stack can be subsequently removed, for example, by ashing.

The memory openings can extend from the top surface of the alternating stack (32, 42) to the top surface of the semiconductor material layer 10 within the substrate. In one embodiment, an overetch into the semiconductor material layer 10 may be optionally performed after the top surface of the semiconductor material layer 10 is physically exposed at a bottom of each memory opening. The overetch may be performed prior to, or after, removal of the lithographic material stack. The recess depth can be, for example, in a range from 0 nm to 50 nm, although lesser and greater recess depths can also be employed. The overetch is optional, and may be omitted. If the overetch is not performed, the bottom surface of each memory opening may be coplanar with the topmost surface of the semiconductor material layer 10. Each of the memory openings can include a sidewall (or a plurality of sidewalls) that extends substantially perpendicular to the topmost surface of the substrate. The region in which the array of memory openings is formed is herein referred to as a device region.

A memory stack structure 55 can be formed in each of the memory opening. Optionally, the second sacrificial material layers 42 can be laterally recessed partially to form lateral recesses (not shown), for example, by an isotropic etch.

Optionally, an epitaxial pedestal (not shown) can be formed at the bottom portion of each memory opening, for example, by selective epitaxy. If present, each epitaxial pedestal comprises a single crystalline semiconductor material in epitaxial alignment with the single crystalline semiconductor material of the semiconductor material layer 10. In one embodiment, the epitaxial pedestal can be doped with electrical dopants of the same conductivity type as the semiconductor material layer 10. In one embodiment, the top surface of each epitaxial pedestal can be formed above a horizontal plane including the top surface of one or more bottommost second sacrificial material layers 42. In this case, at least one source select gate electrode can be subsequently formed by replacing each second sacrificial material layer 42 located below the horizontal plane including the top surfaces of the epitaxial pedestals with a respective conductive material layer. The epitaxial pedestal can be a portion of a semiconductor channel that extends between a source region to be subsequently formed in the semiconductor material layer 10 and a drain region to be subsequently formed in an upper portion of the memory opening. A cavity is present in the unfilled portion of the memory opening above the epitaxial pedestal in each memory opening. In one embodiment, the epitaxial pedestals can comprise single crystalline silicon. In one embodiment, the epitaxial pedestals can have a doping of the first conductivity type, which is the same as the conductivity type of the semiconductor material layer 10.

A stack of layers including a blocking dielectric layer, a memory material layer, and a tunneling dielectric layer can be sequentially deposited in the memory openings. The blocking dielectric layer can be deposited on the sidewalls of each memory opening by a conformal deposition method. The blocking dielectric layer includes a dielectric material, which can be silicon oxide, silicon oxynitride, silicon nitride, a dielectric metal oxide, or a combination thereof. As used herein, a dielectric metal oxide refers to a dielectric material that includes at least one metallic element and at least oxygen. The blocking dielectric layer can be formed by a conformal deposition method such as low pressure chemical vapor deposition, atomic layer deposition, or a combination thereof. The thickness of the blocking dielectric layer can be in a range from 1 nm to 40 nm, although lesser and greater thicknesses can also be employed. The blocking dielectric layer can subsequently function as a dielectric material portion that blocks leakage of stored electrical charges to control gate electrodes. Alternately or additionally, another blocking dielectric layer can be formed after formation of backside recesses on outer surfaces of memory films to be subsequently formed. In case an additional blocking dielectric layer is subsequently formed, the blocking dielectric layer can be omitted at this step.

The memory material layer can be subsequently formed. In one embodiment, the memory material layer can be a contiguous layer or patterned discrete portions of a charge trapping material including a dielectric charge trapping material, which can be, for example, silicon nitride. Alternatively, the memory material layer can include a contiguous layer or patterned discrete portions of a conductive material such as doped polysilicon or a metallic material that is patterned into multiple electrically isolated portions (e.g., floating gates), for example, by being formed within lateral recesses into second sacrificial material layers 42 (in case lateral recesses are present in the second sacrificial material layers 42). In one embodiment, the memory material layer includes a silicon nitride layer. In one embodiment, the second sacrificial material layers 42 and the first sacrificial material layers 32 can have vertically coincident sidewalls, and the memory material layer can be formed as a single contiguous layer. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

In another embodiment, the second sacrificial material layers 42 can have laterally recessed with respect to the sidewalls of the first sacrificial material layers 32, and a combination of a deposition process and an anisotropic etch process can be employed to form the memory material layer as a plurality of memory material portions that are vertically spaced apart. While the present disclosure is described employing an embodiment in which the memory material layer is a single contiguous layer, embodiments are expressly contemplated herein in which the memory material layer is replaced with a plurality of memory material portions (which can be charge trapping material portions or electrically isolated conductive material portions) that are vertically spaced apart. The memory material layer can be formed, for example, by chemical vapor deposition (CVD), atomic layer deposition (ALD), physical vapor deposition (PVD), or any suitable deposition technique for storing electrical charges therein. The thickness of the memory material layer can be in a range from 2 nm to 20 nm, although lesser and greater thicknesses can also be employed.

The tunneling dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunneling dielectric layer can be in a range from 2 nm to 20 nm, although lesser and greater thicknesses can also be employed.

An optional sacrificial cover layer may be employed to provide protection from etchants during an anisotropic etch process to be subsequently performed. The optional sacrificial cover layer can comprise an amorphous or polycrystalline semiconductor material such as amorphous or polycrystalline silicon, a carbon-based material such as amorphous carbon or diamond-like carbon (DLC), or any other material that can protect the vertical portions of the tunneling dielectric layer during a subsequent anisotropic etch or horizontal portions of the stack of layers deposited in the memory openings. The sacrificial cover layer can be removed an anisotropic etch that forms openings through the stack of layers at the bottom of each memory opening.

The optional sacrificial cover layer, the tunneling dielectric layer, the memory material layer, the blocking dielectric layer are sequentially anisotropically etched employing at least one anisotropic etch process. The horizontal portions of the optional sacrificial cover layer, the tunneling dielectric layer, the memory material layer, and the blocking dielectric layer located above the top surface of the insulating cap layer 70 can be removed by the at least one anisotropic etch process. Further, the horizontal portions of the optional sacrificial cover layer, the tunneling dielectric layer, the memory material layer, and the blocking dielectric layer at a bottom of each cavity can be removed to form openings in remaining portions thereof. Subsequently, any remaining portion of the optional sacrificial cover layer can be removed.

A remaining set of layers within each memory opening constitutes a memory film 50, which includes the blocking dielectric layer, the memory material layer, and the tunneling dielectric layer.

A semiconductor channel material layer and an optional dielectric fill material layer can be sequentially deposited in the cavities of the memory openings. The semiconductor channel material layer can include a polycrystalline semiconductor material, or an amorphous semiconductor material that can be subsequently annealed to form a polycrystalline semiconductor material. The semiconductor channel material layer can be an undoped semiconductor material, or can have a doping of the first conductivity type (which is the conductivity type of the semiconductor material layer 10). As used herein, an "undoped" compound semiconductor material refers to a compound semiconductor material in which the imbalance between p-type atoms (e.g., Group IIIA element atoms, or the "boron family" atoms) and n-type atoms (e.g., Group VA element atoms, or the "nitrogen family" elements) does not exceed $1.0 \times 10^{16}/cm^3$. Undoped compound semiconductor materials can be readily deposited by not introducing any dopant gas during deposition of the semiconductor material of the semiconductor channel material layer. In case the semiconductor channel material layer comprises a doped semiconductor material having a doping of the first conductivity type, the atomic concentration of the electrical dopants of the first conductivity type can be in a range from $1.0 \times 10^{16}/cm^3$ to $1.0 \times 10^{18}/cm^3$, although lesser and greater atomic concentrations can also be employed.

In case the cavities in the memory openings are not completely filled by the semiconductor channel material layer, the dielectric fill material layer can be deposited to fill the cavities with a dielectric fill material, which can include silicon oxide (which can be a low etch rate silicon oxide such as undoped silicate glass), silicon oxynitride, silicon nitride, or a combination thereof.

The optional dielectric fill material layer and the semiconductor channel material layer can be subsequently planarized employing the top surface of the insulating cap layer 70 as a stopping layer. A recess etch and/or chemical mechanical planarization (CMP) can be employed to remove the materials of the dielectric fill material layer and the semiconductor channel material layer from above a horizontal plane including the top surface of the insulating cap layer 70. Each remaining portion of the semiconductor channel material layer within a memory opening constitutes a semiconductor channel 60. Each remaining portion of the dielectric fill material layer within a memory opening constitutes a dielectric core 62.

Figure 4:
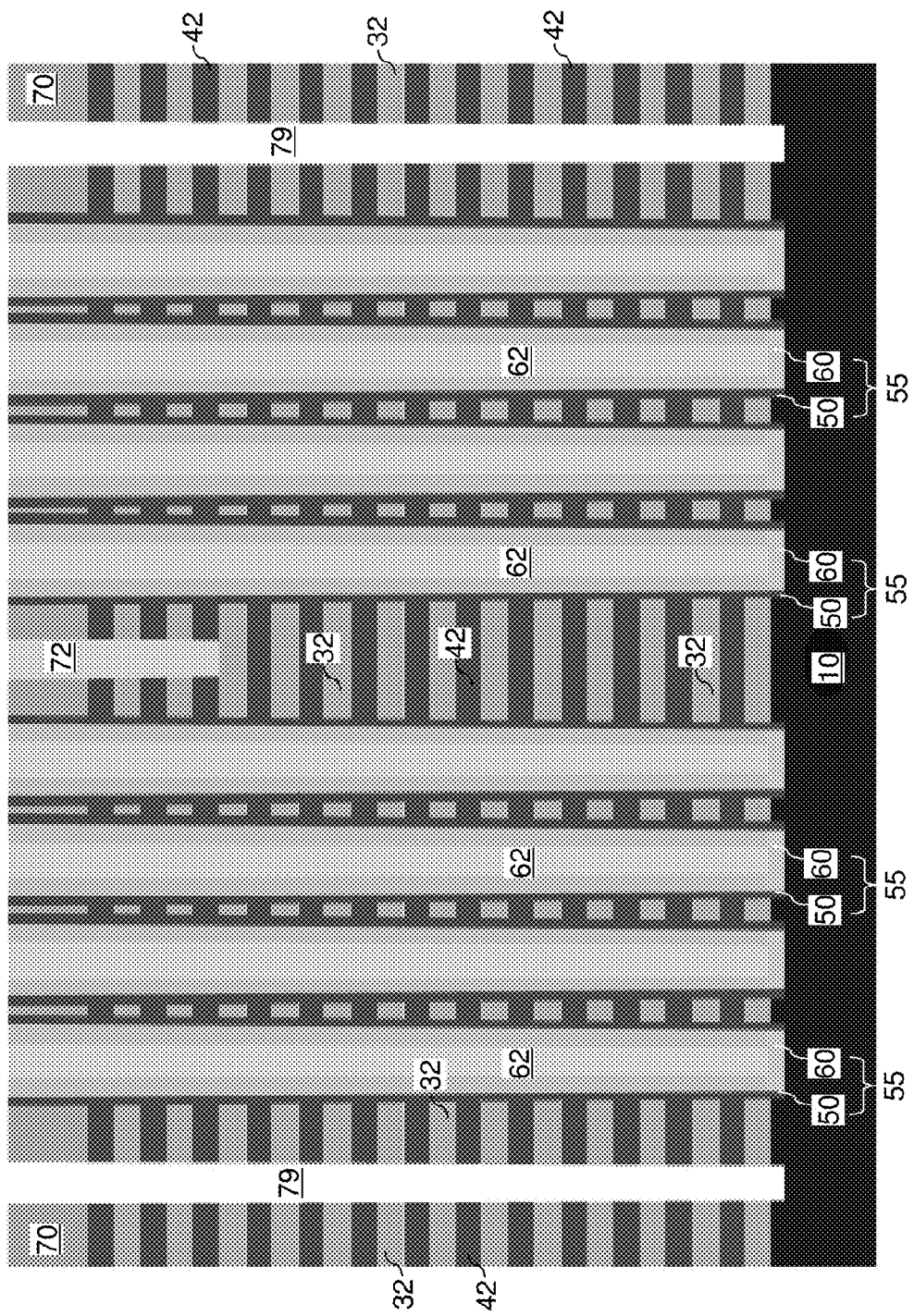
FIG. 4 is a vertical cross-sectional view of the exemplary structure after formation of backside contact trenches according to an embodiment of the present disclosure.

Referring to FIG. 4, trenches 79 can be formed through the stack of alternating layers (32, 42). Specifically, a photoresist layer (not shown) can be applied over the alternating stack (32, 42) and the insulating cap layer 70, and lithographically patterned to form openings therein. The pattern of each opening can extend along a horizontal direction, which is herein referred to as a lengthwise direction. For example, the lengthwise direction can be perpendicular to the plane of the vertical cross-sectional view of FIG. 4. The pattern in the photoresist layer can be transferred through the insulating cap layer 70 and the alternating stack (32, 42) by an anisotropic etch. A trench, which is herein referred to as a backside contact trench 79, is formed in each area underlying the openings in the photoresist layer. The at least one backside contact trench 79 can be a slit trench having a uniform width and extending along its lengthwise direction. Each backside contact trench 79 can extend to a top surface of the semiconductor material layer 10. In one embodiment, the at least one backside contact trench 79 can include a source contact opening in which a source contact via structure can be subsequently formed. The photoresist layer can be subsequently removed, for example, by ashing.

Figure 5:
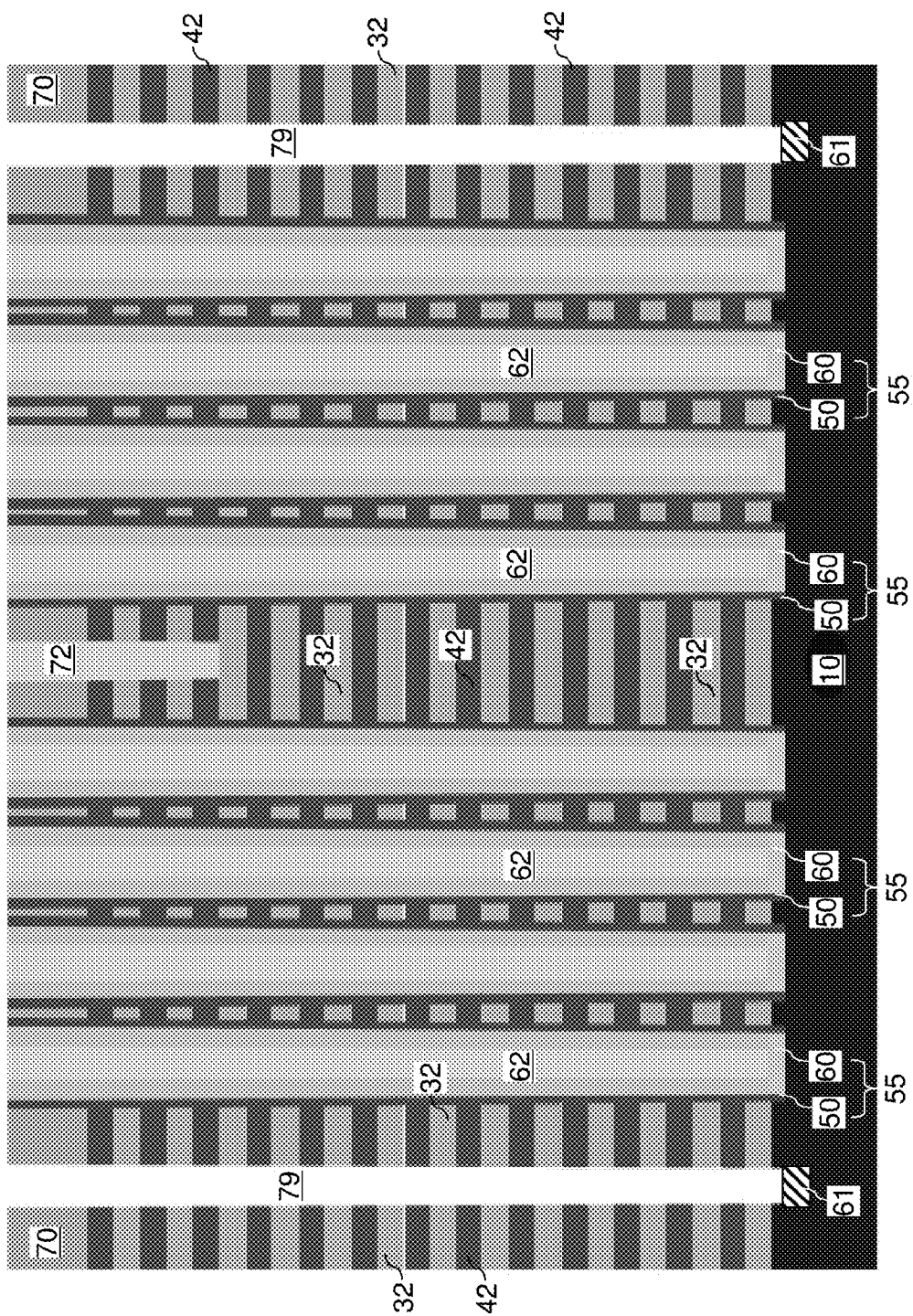
FIG. 5 is a vertical cross-sectional view of the exemplary structure after formation of source regions according to an embodiment of the present disclosure.

Referring to FIG. 5, source regions 61 may be formed by implantation of dopant atoms into a portion of the semiconductor material layer 10 through the backside contact trenches 79. Each source region 61 can be formed within a portion of the substrate that underlies a respective backside contact trench 79. In one embodiment, the source regions 61 can have a doping of the opposite conductivity type (e.g., n-type) with respect to the doping of the semiconductor material layer 10 (e.g., p-type) and the semiconductor channels 60. For example, the semiconductor material layer 10 can have a doping of the first conductivity type, and the source regions 61 can have a doping of the second conductivity type that is the opposite of the first conductivity type. For example, the first conductivity type can be p-type, and the second conductivity type can be n-type. The atomic concentration of dopants of the second conductivity type in the source regions can be in a range from $1.0 \times 10^{19}/cm^3$ to $2.0 \times 10^{21}/cm^3$, although lesser and greater atomic concentrations can also be employed. In one embodiment, a horizontal semiconductor channel can be disposed between each source region 61 and a respective group of semiconductor channels 60 that are located adjacent to the source region 61. The photoresist layer can be subsequently removed, for example, by ashing.

Figure 6:
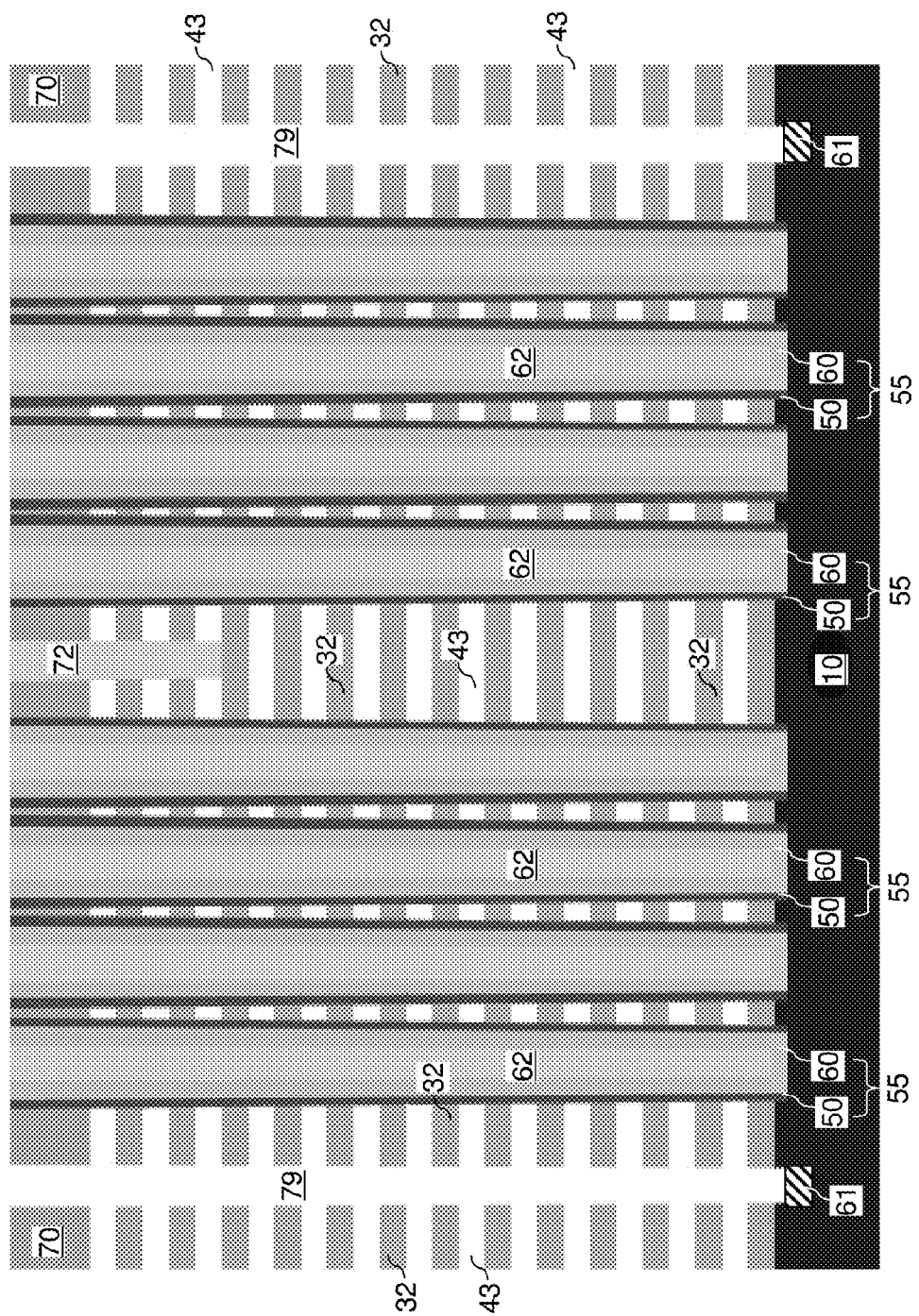
FIG. 6 is a vertical cross-sectional view of the exemplary structure after removal of the second material layers according to an embodiment of the present disclosure.

Referring to FIG. 6, backside recesses 43 are formed at each level of the second sacrificial material layers 42 by removing the second sacrificial material layers 42 selective to the first sacrificial material layers 32 and the semiconductor material of the semiconductor material layer 10. Specifically, an etchant that removes the second material of the second sacrificial material layers 42 selective to the first material of the first sacrificial material layers 32 is introduced into the backside contact trenches 79 in a liquid phase (in a wet etch) or in a gas phase (in a dry etch). The second material of the second sacrificial material layers 42 is removed to form backside recesses 43 at each level from which the second sacrificial material layers 42 are removed. As used herein, a backside recess refers to a recess that is formed on the outside of the memory openings. In contrast, the memory openings are herein referred to as front side openings. A subset of the backside recesses 43 can be formed at the levels through which the isolation insulator structure 72 extends, which can be the levels of drain select gate electrodes to be subsequently formed.

The removal of the second sacrificial material layers 42 is selective to the first sacrificial material layers 32, the memory stack structures 55, and the semiconductor material of the semiconductor material layer 10. In one embodiment, the second sacrificial material layers 42 can comprise silicon nitride, germanium, a silicon-germanium alloy, or carbon, and the first sacrificial material layers 32 can comprise doped silicate glass, porous silicate glass, or organosilicate glass, and the semiconductor material layer 10 can be a silicon layer. Alternative combinations are also possible. If the second sacrificial material layers 42 comprise silicon nitride, germanium, or a silicon-germanium alloy, the selective removal of the second sacrificial material layers 42 can be performed by a wet etch employing hot phosphoric acid or a combination of hydrogen peroxide and dilute hydrofluoric acid. If the second sacrificial material layers 42 comprise carbon, the selective removal of the second sacrificial material layers 42 can be performed by ashing. An alternating stack of backside recesses 43 and the first sacrificial material layers 32 is formed. Outer sidewalls of the memory stack structures 55 can be physically exposed at each level of the backside recesses 43.

Figure 7:
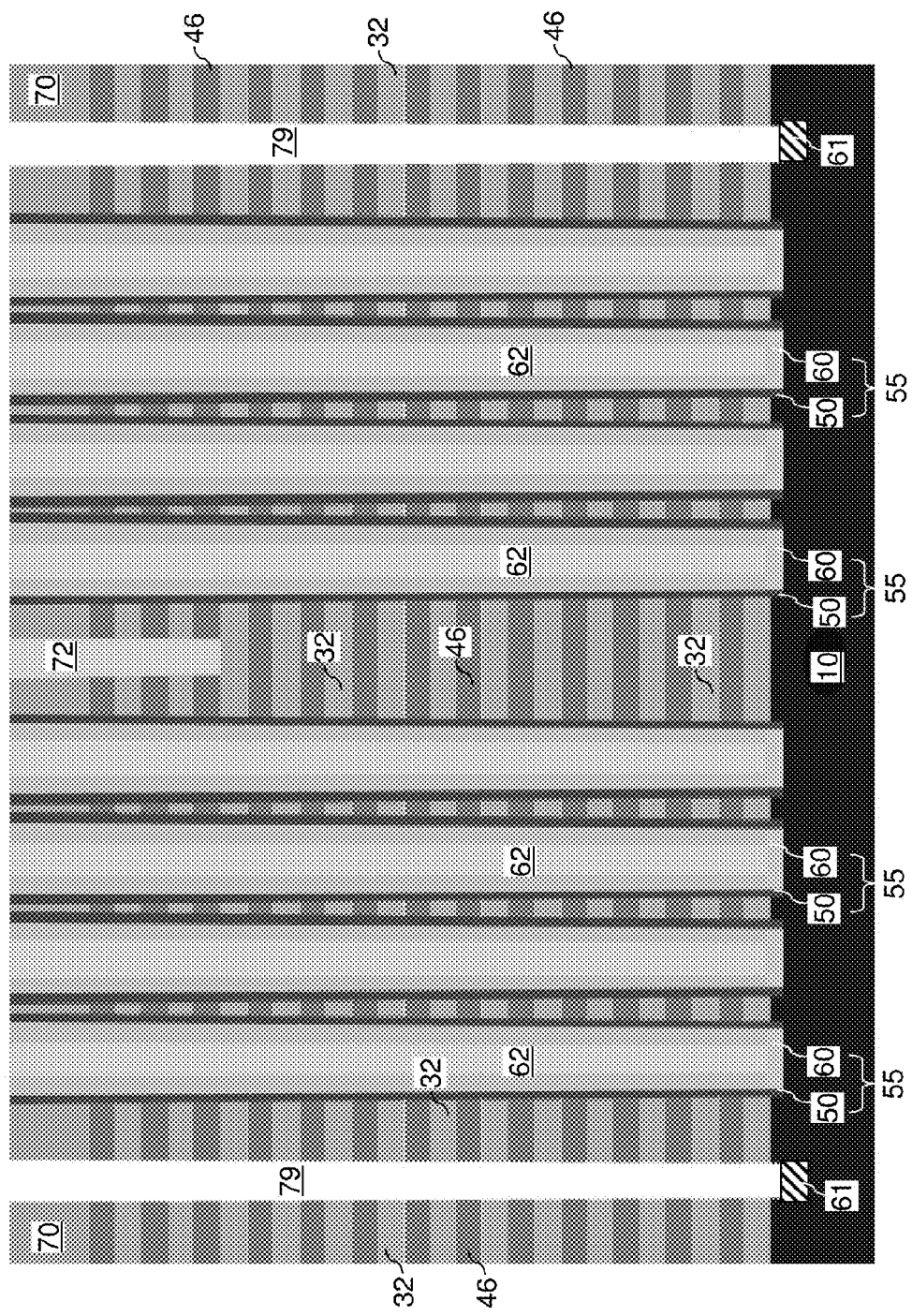
FIG. 7 is a vertical cross-sectional view of the exemplary structure after formation of electrically conductive layers according to an embodiment of the present disclosure.

Referring to FIG. 7, at least one metallic material can be deposited in the plurality of backside recesses 43, on the sidewalls of the at least one backside contact trench 79, and over the top surface of the insulating cap layer 70. As used herein, a metallic material refers to an electrically conductive material that includes at least one metallic element. The at least one conductive material is deposited in the backside recesses 43 and in a peripheral portion of the backside contact trench 79.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a contiguous metallic material layer (not shown) can be formed on the sidewalls of each backside contact trench 79 and over insulating cap layer 70. Thus, each sacrificial material layer 42 can be replaced with an electrically conductive layer 46. A backside cavity is present in the portion of each backside contact trench 79 that is not filled with the contiguous metallic material layer.

The deposited metallic materials of the contiguous electrically conductive material layer is etched back from the sidewalls of each backside contact trench 79 and from above the insulating cap layer 70, for example, by an isotropic etch. Upon removal of the portion of the deposited at least one conductive material from inside the backside contact trench 79, each remaining portion of the deposited metallic material in the backside recesses 43 constitutes an electrically conductive layer 46. Each electrically conductive layer 46 can be a conductive line structure. Thus, the second sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 in the middle of the stack can be a word line that functions as a common control gate electrode for the plurality of vertical memory devices. The electrically conductive layers 46 at the top of the stack (e.g., three layers 46 adjacent to insulator structure 72) may function as drain select gate electrodes while one or more conductive layers 46 at the bottom of the stack may function as source select gate electrodes.

Figure 8:
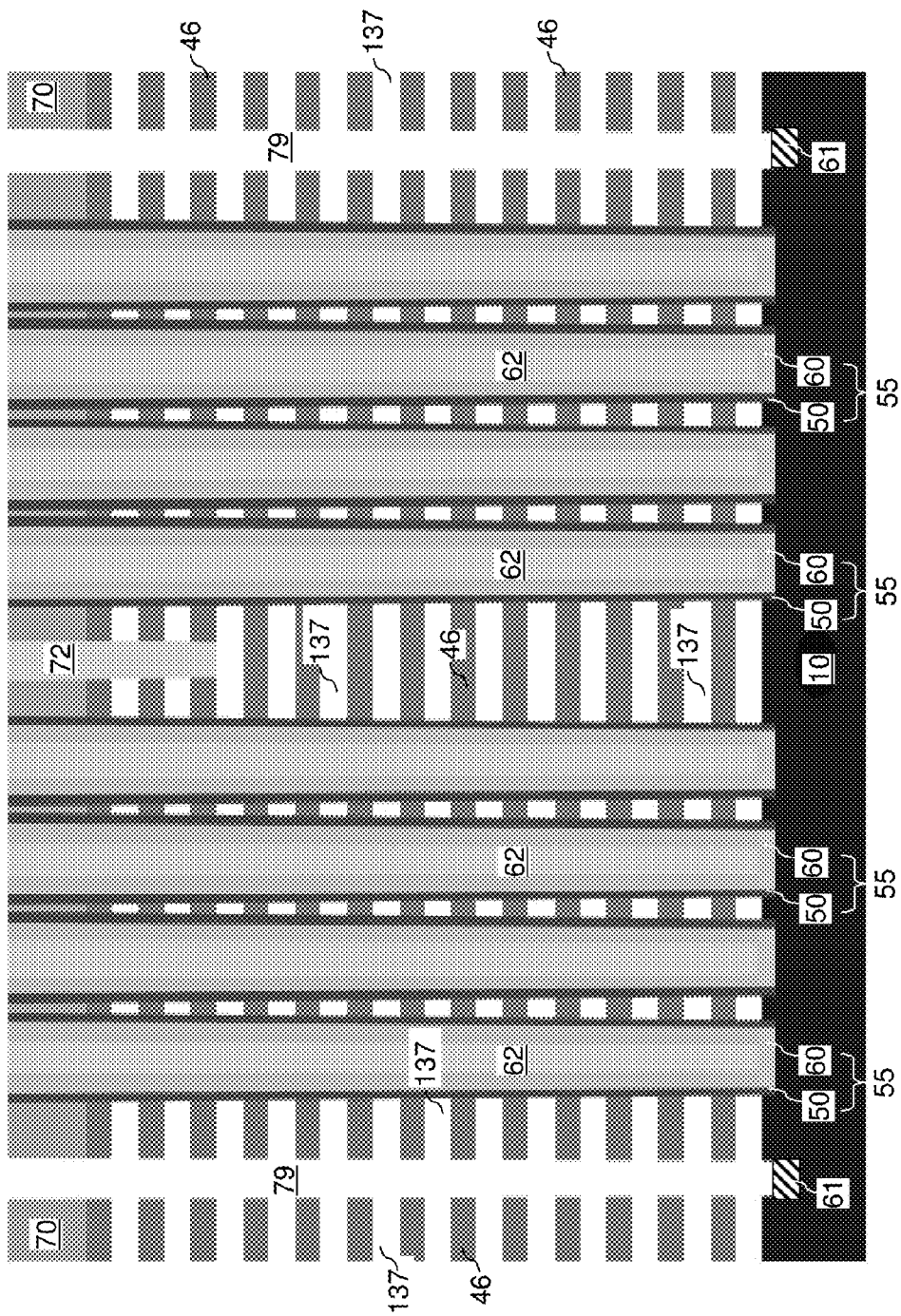
FIG. 8 is a vertical cross-sectional view of the exemplary structure after removal of the first material layers according to an embodiment of the present disclosure.

Referring to FIG. 8, the first sacrificial material layers 32 can be removed selective to the electrically conductive layers 46, the memory stack structures 55, and the semiconductor material of the semiconductor material layer 10. In one embodiment, if the first sacrificial material layers 32 comprise porous silicon oxide, doped silicate glass (such as borosilicate glass) or organosilicate glass, a wet etch employing hydrofluoric acid can be employed. If the first sacrificial material layers 32 comprise carbon (such as amorphous carbon or diamond-like carbon (DLC), the first sacrificial material layers 32 can be removed by ashing. If the first sacrificial material layers 32 comprise germanium or a silicon-germanium alloy, the first sacrificial material layers 32 can be removed by a wet etch employing hydrofluoric acid and hydrogen peroxide. Horizontal surfaces of the electrically conductive layers 46 can be physically exposed by removal of the first sacrificial material layers 32 selective to the electrically conductive layers 46.

Lateral cavities 137 are formed in volumes from which the first sacrificial material layers 32 are removed. As used herein, a "lateral cavity" or a "laterally extending cavity" refers to a cavity having a greater horizontal width than vertical height, which may in one embodiment have a substantially uniform height throughout. The lateral cavities 137 are adjoined to a vertically extending cavity of a backside contact trench 79. As used herein, a "vertically extending cavity" refers to a cavity that extends along a vertical direction with vertical sidewalls or tapered sidewalls.

Figure 9:
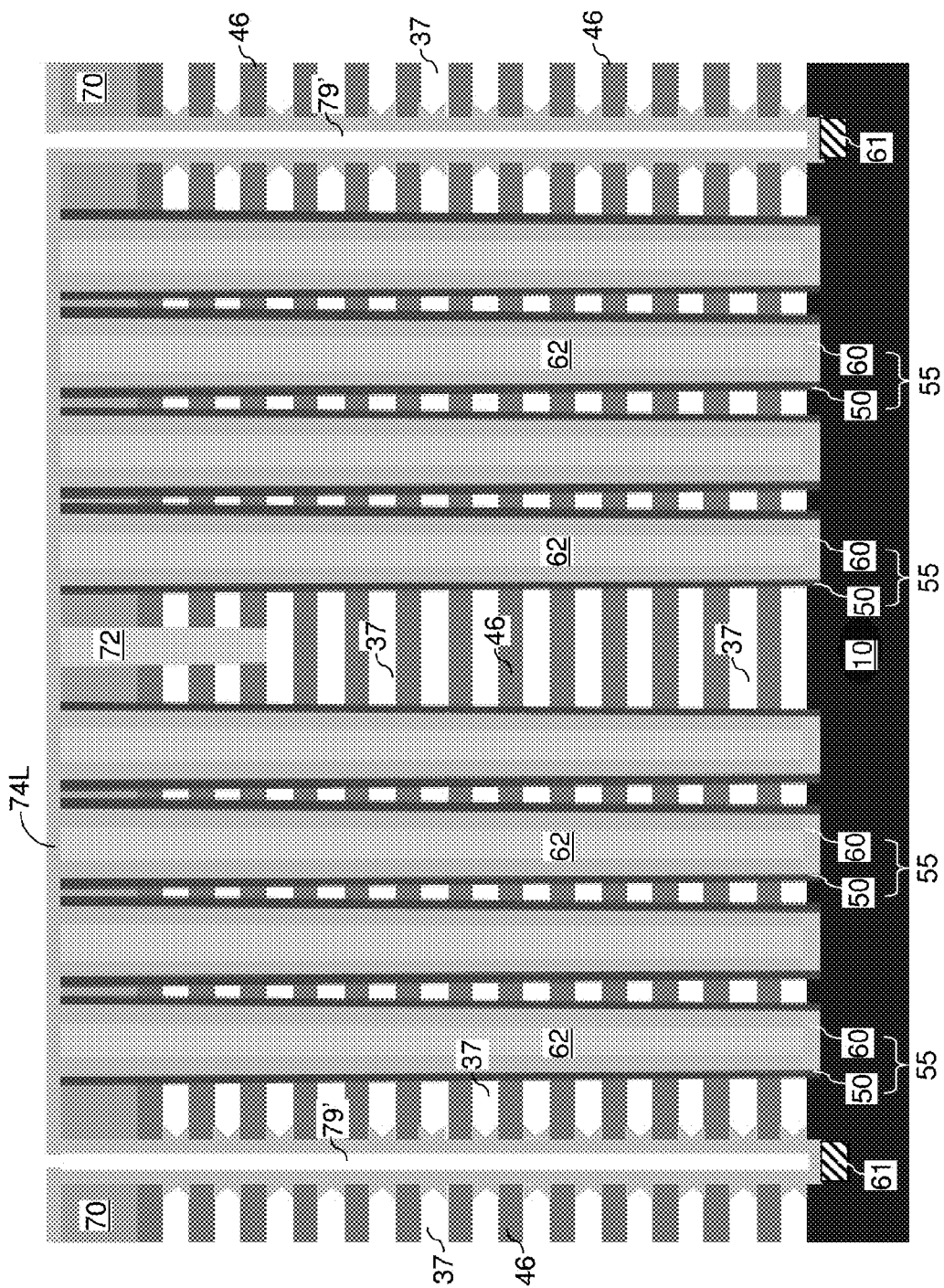
FIG. 9 is a vertical cross-sectional view of the exemplary structure after formation of a contiguous dielectric material layer according to an embodiment of the present disclosure.

Referring to FIG. 9, a contiguous dielectric material layer 74L can be formed by depositing a dielectric material on sidewalls of the backside contact trench 79 and on portions of horizontal surfaces of the electrically conductive layers 46 that are proximal to the backside contact trench 79, while not depositing the dielectric material on surfaces of the electrically conductive layers 46 that are distal from the backside contact trench 79.

The contiguous dielectric material layer 74L can be formed by a deposition process in which supply of at least one reactant is laterally limited in lateral cavities 137, while not being vertically limited within the backside contact trench 79. Lateral limitation of the quantity of available reactant inside the lateral cavities 137 can be induced by employing an anisotropic atomic layer deposition. In an anisotropic atomic layer deposition process, supply of an active reactant gas species is spatially limited, and particularly, laterally limited. The anisotropic atomic layer deposition can be a plasma assisted atomic layer deposition (PAALD) in which a reactant gas species is active as the reactive reactant gas species in a plasma form, and is not active in a non-plasma form. Further, the availability of plasma-activated reactant can decrease significantly with a lateral distance from an adjoining backside contact trench 79 in each lateral cavity in the plasma assisted atomic layer deposition process (PAALD).

In one embodiment, the dielectric material can be silicon oxide, and the plasma assisted atomic layer deposition can employ a plasma of a silicon-containing gas as the active reactant gas species. In an illustrative example, the contiguous dielectric material layer 74L can include silicon oxide deposited employing bis(diethylamino)silane (BDEAS; $H_2S(NC_2H_5)_2$) as a silicon-containing precursor and an oxidant (such as $O_2$ or ozone). An exemplary set of process conditions for deposition of silicon oxide employing bis(diethylamino)silane on a 300 mm diameter substrate include deposition temperature of 70 to 400 degrees Celsius, such as about 75 degrees Celsius, pressure of about 300 Pascal to 500 Pascal (such as about 400 Pascal), RF power during deposition of about 150 Watts to 250 Watts (such as about 200 Watts), oxygen flow rate of about 3 standard liters per minute (slm) to 5 slm (such as about 4 slm), and a flow rate of about 1.5 to 3, such as about 2 standard liters per minute for a gas mixture of BDEAS and argon. The molar fraction of BDEAS in the gas mixture of BDEAS and argon is determined by the temperature of a canister containing the BDEAS in a liquid phase, which is vaporized into an argon carrier stream by heating the canister at a controlled temperature, which can be, for example, in a range from 30 degrees Celsius to 70 degrees Celsius (such as 35 degrees Celsius).

Since a PAALD process is cyclic, gas feed time, purge time, radio frequency (RF) plasma application time, and post-RF purge time can be controlled to enhance anisotropy of the deposition process. In an illustrative example, source gas (BDEAS) feed time can be in a range from 0.1 second to 0.4 second (such as 0.2 second), source gas (BDEAS) purge time can be in a range from 0.2 second to 1.0 second (such as 0.3 second), RF power application time can be in a range from 0.1 second to 0.4 second (such as 0.2 second), and post-RF purge time can be in a range from 0.1 second to 0.5 second (such as 0.1 second), although lesser and greater time periods can also be employed for each of the steps in the PAALD process.

Each deposition cycle can commence with a silicon containing precursor feed step, such as a silicon containing source gas feed step, in which the source gas (such as BDEAS) is flowed into the process chamber including the exemplary structure. The source gas is adsorbed on O—H bond sites of the physically exposed surfaces of the exemplary structure, i.e., on the sites on which O—H bonds can be formed. One amino group is removed during the adsorption, which occurs during the source gas feed step.

A source gas purge step is subsequently performed, in which the residual source gas is purged with an inert gas such as argon. The source gas purge step prevents vapor phase reaction of the purged source gas. Thus, oxygen reacts with the adsorbed monolayer on the substrate when oxygen is supplied during a subsequent RF plasma step. Further, the source gas purge step prevents generation of silicon-containing plasma species during the subsequent RF plasma step if all source gas is purged or reduces the generation of silicon-containing plasma species if some source gas remains in the process chamber.

An RF plasma application step is subsequently performed, in which active oxygen is supplied, for example, by flowing $O_2$ gas, and generates an oxygen plasma. A second amino group can be removed from the adsorbed molecules that react with the oxygen plasma, thereby regenerating an O—H bond site on the deposited monolayer. In one embodiment, the RF plasma may be pulsed.

A post-RF purge step is subsequently performed. The cycle of the process steps can be repeated until a target deposition thickness is achieved.

In one embodiment, the dielectric material can be deposited on first portions of the horizontal surfaces of the electrically conductive layers 46 that are proximal to the backside contact trench 79 to form the contiguous dielectric material layer 74L, while not depositing the dielectric material on second portions of the horizontal surfaces of the electrically conductive layers 46 that are more distal from the backside contact trench 79 than the first portions.

Referring to FIG. 10A, an in-process structure during the atomic layer deposition process employed to form the contiguous dielectric material layer 74L is illustrated. FIG. 10A illustrates the deposited dielectric material at a microscopic level after a single cycle of the anisotropic atomic layer deposition. A first-atomic-species layer 74A can be formed on the sidewall surfaces of the electrically conductive layers 46 located at a periphery of the backside contact trench 79 and on portions of the horizontal surfaces of the electrically conductive layers 46 that are proximal to the backside contact trench 79 due to the limitation on availability of active radicals of the first-atomic-species in the first cycle of the anisotropic atomic layer deposition. The first-atomic-species layer 74A includes atoms of the first atomic species, i.e., atoms of a first kind. In one embodiment, the first-atomic-species layer 74A can include silicon atoms.

Subsequently, a second-atomic-species layer 74B can be formed on the surfaces of the first-atomic-species layer 74A. The second-atomic-species layer 74B includes atoms of the second atomic species, i.e., atoms of a second kind. The second atomic species may not be deposited on the physically exposed surfaces of the electrically conductive layers 46, or can combine with the atoms of the electrically conductive layers 46 at the physically exposed surfaces of the electrically conductive layers 46 to provide a passivated surface that does not interact with atoms of the second atomic species in subsequent steps of the anisotropic atomic layer deposition. In one embodiment, the second-atomic-species layer 74B can include oxygen atoms. While two separate layers 74A and 74B are shown in FIG. 10A to illustrate the deposition process, it should be understood that oxidation of silicon layer 74A forms a single silicon oxide layer.

Figure 10B:
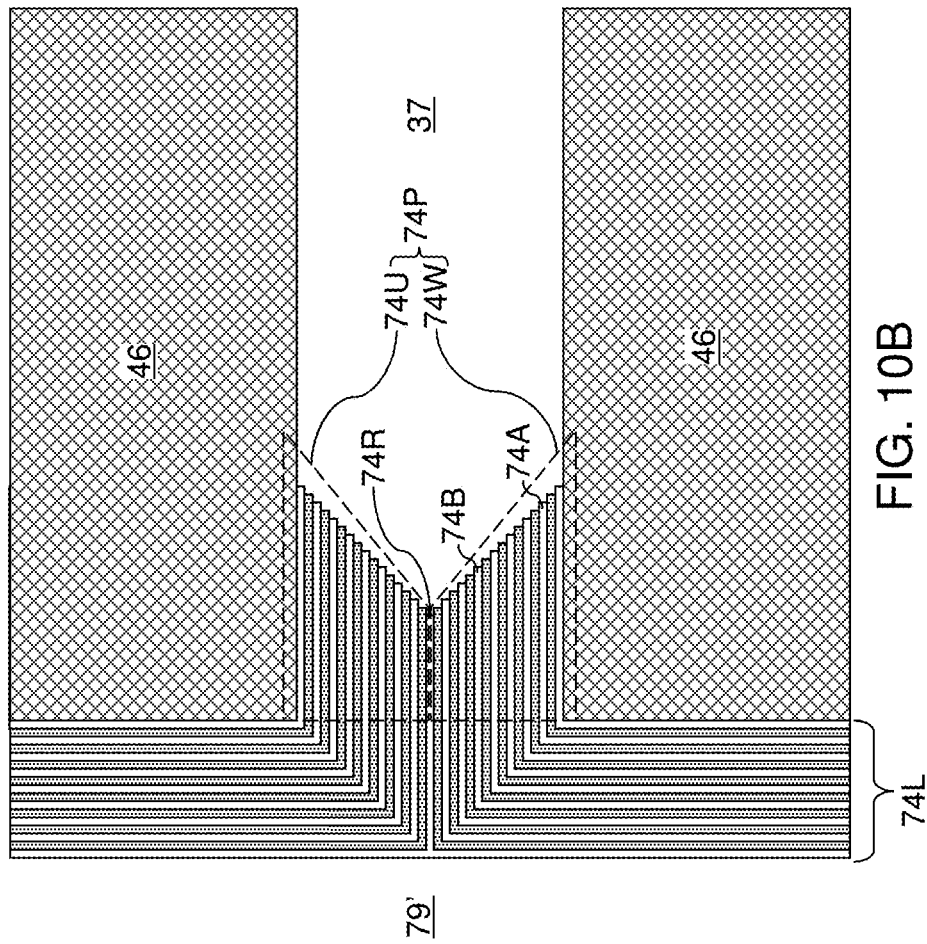
FIG. 10B is a vertical cross-sectional view of a portion of the exemplary structure after the atomic layer deposition process.

Referring to FIG. 10B, additional cycles of the anisotropic atomic later deposition process is repeated to form an alternating stack of first-atomic-species layers 74A and second-atomic-species layers 74B, which constitutes the contiguous dielectric material layer 74L. In one embodiment, the cycles of the anisotropic atomic layer deposition process can continue until accumulated deposition of the dielectric material forms encapsulated cavities 37 in a portion of each volume of the lateral recesses 137 as originally formed. The encapsulated cavities 37 can have a lesser volume than the original lateral cavity 137 at the same level.

Successive layers within the first-atomic-species layers 74A and second-atomic-species layers 74B can be deposited only within the area of a previously deposited layer among the first-atomic-species layers 74A and second-atomic-species layers 74B. Thus, the periphery of a deposited layer among the first-atomic-species layers 74A and second-atomic-species layers 74B can be shifted outward (toward the backside contact trench 79) with each successively deposited layer within the contiguous dielectric material layer 74L. Thus, the thickness of the dielectric material on each first portion of the horizontal surface of the electrically conductive layers 46 can decrease with the lateral distance from the periphery of the backside contact trench 79, i.e., from a substantially vertical plane including the interface between sidewalls of the electrically conductive layers 46 and the contiguous dielectric material layer 74L. A cavity 79' can be present within the unfilled volume of the backside contact trench 79.

Deposition of the dielectric material can form an encapsulated cavity (i.e., air gap or vacuum gap) 37 at each level between vertically neighboring pairs of electrically conductive layers 46. Each encapsulated cavity 37 can be bounded by a sidewall of a respective protruding portion 74P of the contiguous dielectric material layer 74L that protrudes outward from a vertical plane including sidewalls of the electrically conductive layers 46. In one embodiment, each laterally protruding portion 74P comprises an upper protruding region 74U and a lower protruding region 74W that are adjoined to each other at a horizontal trough 74R which corresponds to a ridge in the adjacent portion of the cavity 37. In one embodiment, the sidewall of the respective protruding portion comprises a pair of slanted surfaces adjoined at the horizontal trough 74R.

The thickness of the contiguous dielectric material layer 74L, as measured on the sidewalls of the electrically conductive layers 46, can be greater than one half of the maximum spacing between vertically neighboring pairs of electrically conductive layers 46, i.e., can be greater than one half of the maximum height of the encapsulated cavities 37. In one embodiment, the thickness of the contiguous dielectric material layer 74L can be greater than 35 nm, such as 40-80 nm, for example 40-50 nm, to completely encapsulate the cavities 37.

In one embodiment, portions of the horizontal surfaces of an overlying electrically conductive layer 46 and an underlying electrically conductive layer 46 and portions of sidewall surfaces of the memory stack structures 55 can be physically exposed to the encapsulated cavity 37 that is spatially bounded by the overlying and underlying electrically conductive layers 46, the memory stack structures 55, and the contiguous dielectric material layer 74L. At least one of the encapsulated cavities 37 can have a boundary that includes portions of sidewall surfaces of the plurality of memory stack structures 55. At least one of the encapsulated cavities 37 can have a set of boundary surfaces comprising portions of horizontal surfaces of a vertically neighboring pair of electrically conductive layers 46 and a non-planar sidewall of the contiguous dielectric material layer 74L, i.e., a pair of tapered sidewalls that are adjoined at the horizontal ridge of the cavity (which corresponds to the trough 74R in the layer 74L) at a midlevel of the respective encapsulated cavity 37.

Figure 11:
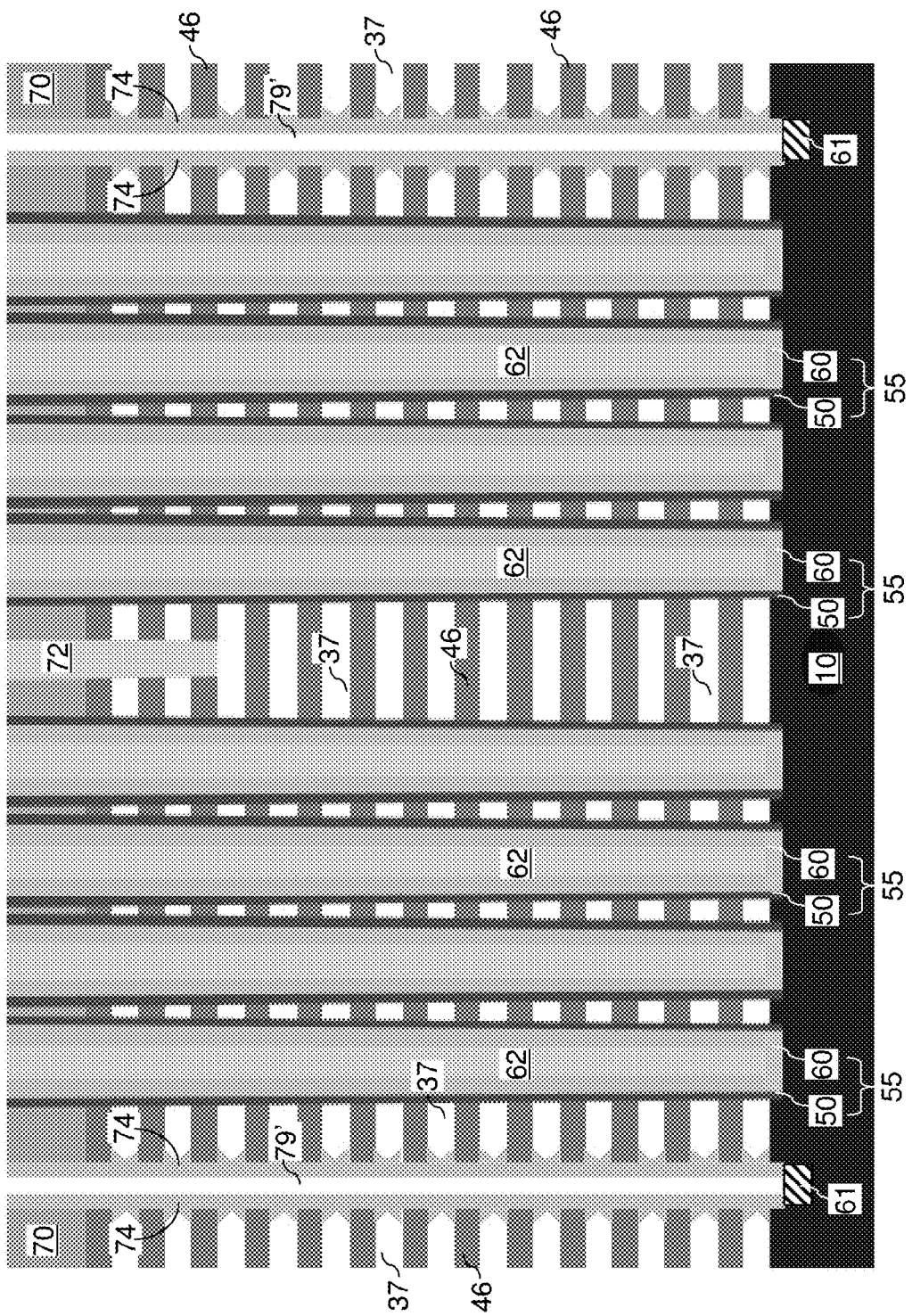
FIG. 11 is a vertical cross-sectional view of the exemplary structure after formation of insulating spacers according to an embodiment of the present disclosure.

Referring to FIG. 11, an anisotropic etch is performed to remove horizontal portions of the contiguous dielectric material layer 74L from above the source regions 61 and from above the insulating cap layer 70. Each remaining portion of the contiguous dielectric material layer 74L inside a backside contact trench 79 constitutes a vertically elongated annular structure with a vertical cavity 79' extending therethrough, which is herein referred to as an insulating spacer 74. In one embodiment, an annular bottom surface of the insulating spacer 74 contacts a top surface of the source region 61. Each insulating spacer 74 can be formed over the sidewalls of the backside contact trench 79, and can be formed directly on the sidewalls of the electrically conductive layers 46.

Figure 12:
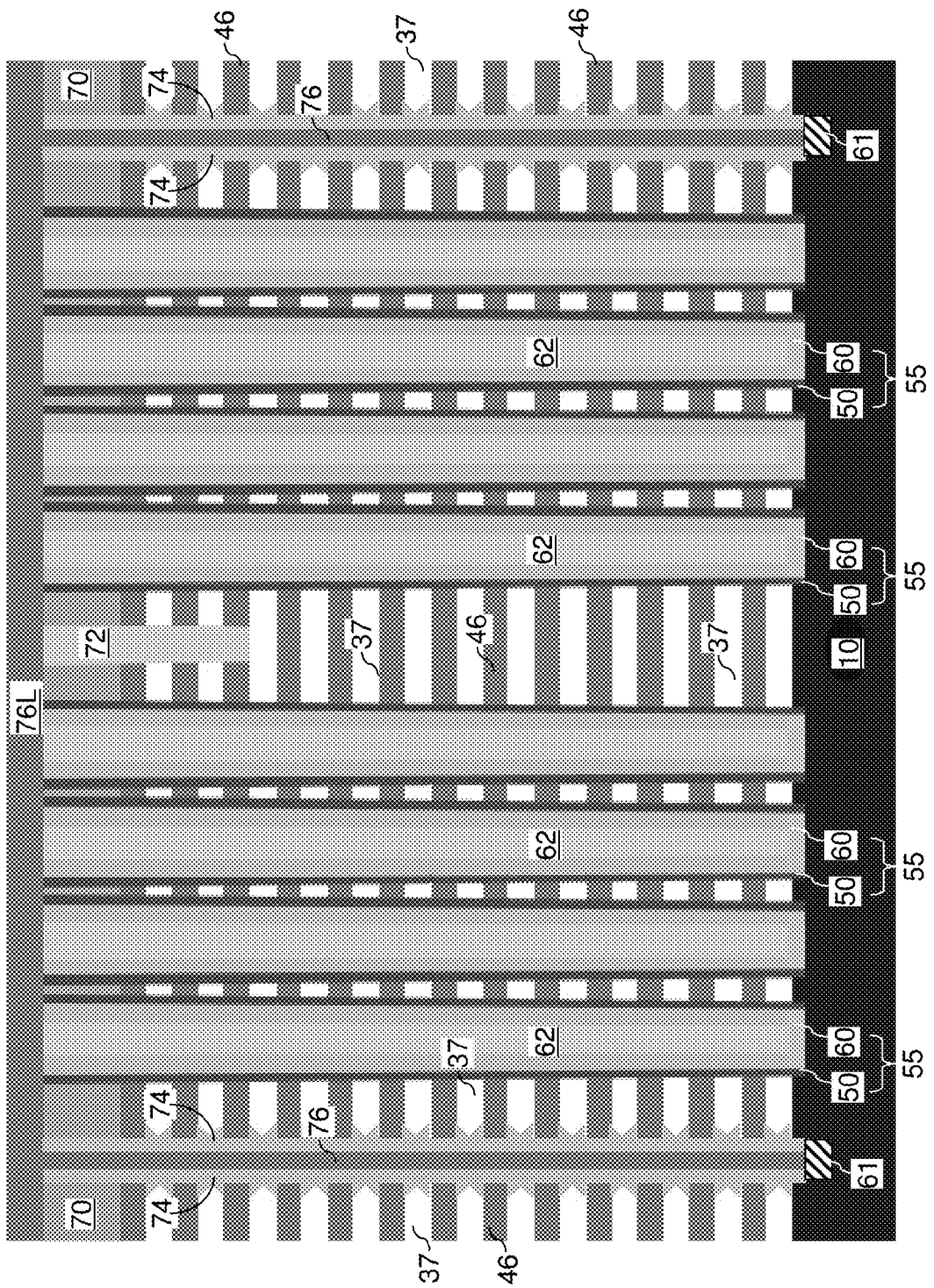
FIG. 12 is a vertical cross-sectional view of the exemplary structure after deposition of at least one conductive material in the cavities within the backside contact trenches according to an embodiment of the present disclosure.

Referring to FIG. 12, at least one conductive material can be deposited in the vertical cavities 79' and over the insulating cap layer 70. The at least one conductive material can include an elemental metal, an intermetallic alloy, a conductive metallic nitride, and/or a conductive metallic carbide. In one embodiment, the at least one conductive material can include a combination of a metallic nitride liner and an elemental metal. The metallic nitride liner can include, for example, titanium nitride, tantalum nitride, and/or tungsten nitride, and the elemental metal can include tungsten, cobalt, ruthenium, copper, and/or aluminum. In one embodiment, the at least one conductive material can be deposited by chemical vapor deposition, physical vapor deposition, electroplating, electroless plating, or a combination thereof.

Each portion of the at least one conductive material that fills the vertical cavities 79' constitutes a backside contact via structure 76, which provides electrical and physical contact to a respective source region 61. The horizontal portion of the at least one conductive material deposited over the top surface of the insulating cap layer 70 constitutes a conductive material layer 76L. Each backside contact via structure 76 is formed within an insulating spacer 74.

Figure 13:
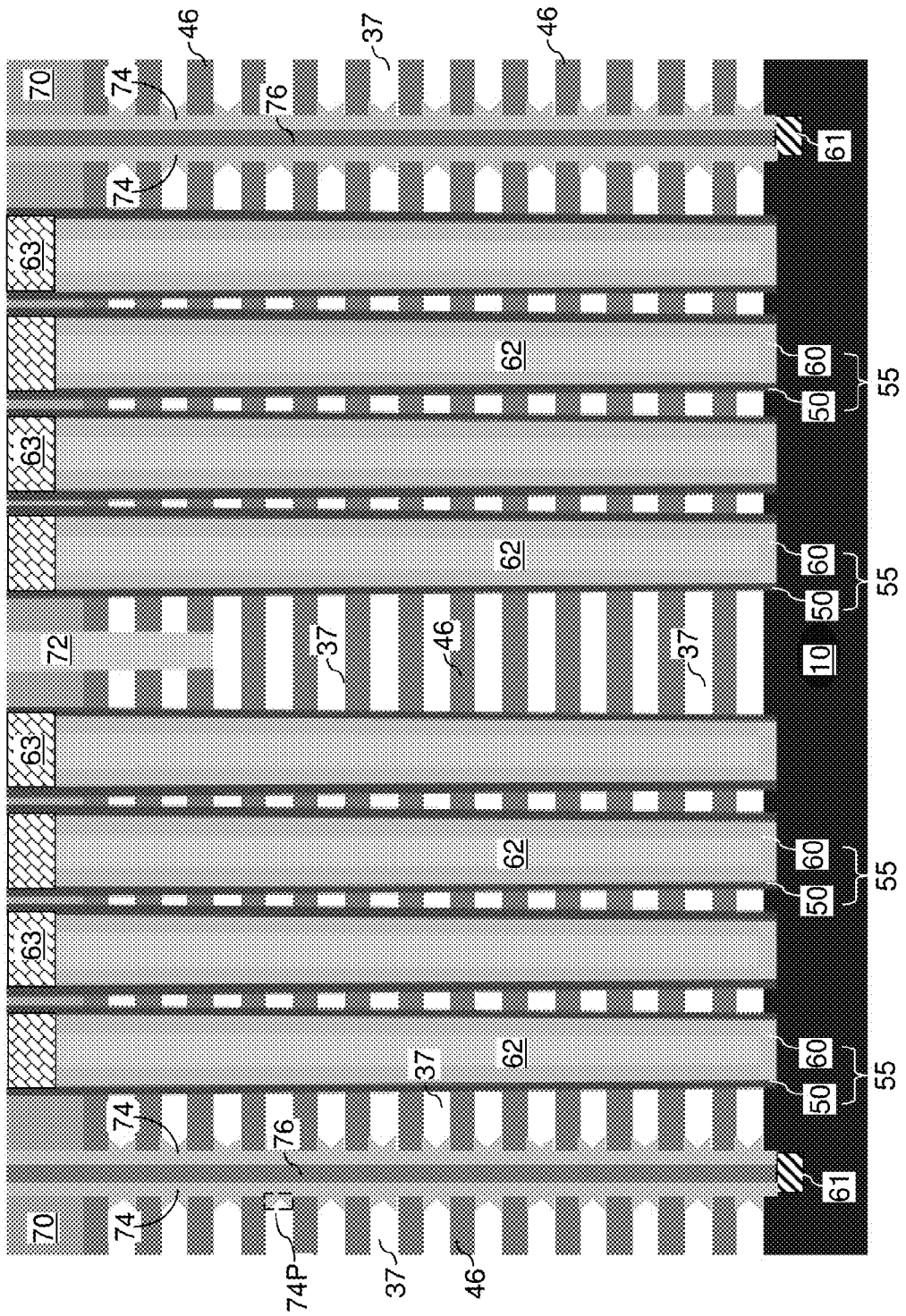
FIG. 13 is a vertical cross-sectional view of the exemplary structure after formation of drain regions according to an embodiment of the present disclosure.

Referring to FIG. 13, the conductive material layer 76L can be removed from above the top surface of the insulating cap layer 70. The removal of the conductive material layer 76L can be performed, for example, by chemical mechanical planarization (CMP) and/or a recess etch.

Subsequently, physically exposed portions of the dielectric cores 62 and the semiconductor channels 60 can be vertically recessed to form recess regions. The recess regions can be filled with a doped semiconductor material, and excess portions of the doped semiconductor material from above the top surface of the insulating cap layer 70 can be removed by a planarization process. The doped semiconductor material can have a doping of the second conductivity type, which is the opposite of the first conductivity type of the semiconductor material layer 10, and is the same conductivity type as the conductivity type of the source regions 61. The remaining portions of the doped semiconductor material after the planarization process constitute drain regions 63.

Additional contact via structures can be formed various conductive elements such as the electrically conductive layers 46. For example, the second sacrificial material layers 42 can be patterned with stepped surfaces in a contact region (not shown) after the processing steps of FIG. 1 and prior to the processing steps of FIG. 4, and a dielectric material portion (not shown) can be formed in the contact region. Contact via cavities can be formed through the dielectric material portion in the contact region, and filled with a conductive material to form contact via structures that provide electrical contact to the electrically conductive layers 46. The electrically conductive layers 46 can function as control gate electrodes and select gate electrodes of a three-dimensional memory structure, and the contact via structures that contact the electrically conductive layers 46 can be control gate contact via structures. Additional contact via structures can be formed to semiconductor device for the peripheral circuitry (which can include a driver circuit).

The exemplary structure can comprise a monolithic three-dimensional memory device. The monolithic three-dimensional memory device can include a plurality of electrically conductive layers 46 vertically spaced apart by cavities 37 that are present between each vertically neighboring pair of electrically conductive layers 46. Each of the electrically conductive layers 46 is mechanically supported by a plurality of memory stack structures 55 extending through the alternating stack (46, 37) and located over a substrate 10. The monolithic three-dimensional memory device can further include a backside contact trench 79 extending through the plurality of electrically conductive layers 46 and each level of the cavities 37. An insulating spacer 74 is located along a periphery of the backside contact trench, and comprises laterally protruding portions 74P that protrude outward from a vertical plane including an interface between the insulating spacer 74 and the electrically conductive layers 46. Each laterally protruding portion 74P is located between a respective vertically neighboring pair of electrically conductive layers 46, and has a non-vertical sidewall that defines a boundary of a respective cavity 37. A backside contact via structure 76 is located within the insulating spacer 74, and is electrically shorted to a portion of the substrate (i.e., a source region 61).

At least one of the encapsulated cavities 37 can have a set of boundary surfaces comprising portions of horizontal surfaces of a vertically neighboring pair of electrically conductive layers 46 and a non-planar sidewall of the insulating spacer 74. In one embodiment, each laterally protruding portion 74P comprises an upper protruding region 74U and a lower protruding region 74W that are adjoined to each other at a horizontal trough 74R. In one embodiment, each of the upper protruding region 74U and the lower protruding region 74L can have a thickness that decreases with a lateral distance from a periphery of the backside contact trench 79. In one embodiment, each cavity 37 can be an encapsulated cavity of which a vertical extent is bounded by a bottom surface of an overlying electrically conductive layer 46 and a top surface of an underlying electrically conductive layer 46. In one embodiment, each encapsulated cavity 37 can be bounded by a sidewall of a respective protruding portion of the insulating spacer 74 that protrudes outward from a vertical plane including sidewalls of the electrically conductive layers 46.

In one embodiment, the entire boundary of the encapsulated cavity 37 can be defined by a set of surfaces including a portion of the bottom surface of the overlying electrically conductive layer 46 and a portion of the top surface of the underlying electrically conductive layer 46. In one embodiment, the set of surfaces can comprise portions of sidewall surfaces of the plurality of memory stack structures 55. In one embodiment, the set of surfaces comprises a non-planar sidewall of the insulating spacer 74 extending between the bottom surface of the overlying electrically conductive layer 46 and the top surface of the underlying electrically conductive layer 46. In one embodiment, the non-planar sidewall comprises a pair of slanted surfaces adjoined at a horizontal trough 74R. Thus, each encapsulated cavity may have three substantially planar sidewalls formed by two gate electrodes 46 and a vertical sidewall of the memory stack 55, and one non-planar sidewall formed by the spacer 74.

In one embodiment, the plurality of memory stack structures 55 can be located within a plurality of memory openings, and each memory stack structure 55 can comprise a memory film 50 and a semiconductor channel 60 contacting an inner sidewall of the memory film 50. In one embodiment, drain regions 63 can be located on each top portion of the semiconductor channels 60, and a source region 61 can be located in a portion of the substrate that underlies the backside contact trench 79. A horizontal semiconductor channel can be disposed between the source region 61 and the semiconductor channels 60 within the memory stack structures 55. In one embodiment, the electrically conductive layers 46 can comprise a metallic material (such as tungsten, tungsten nitride, titanium nitride, cobalt, or ruthenium), and the insulating spacer 74 can comprise silicon oxide. In one embodiment, the monolithic three-dimensional memory device can comprise a vertical NAND memory device, and the substrate can comprise a silicon substrate. The NAND memory device can comprise an array of monolithic three-dimensional NAND strings over the silicon substrate. At least one memory cell in the first device level of the three-dimensional array of NAND strings can be located over another memory cell in the second device level of the three-dimensional array of NAND strings. The silicon substrate can contain an integrated circuit comprising a driver circuit for the memory device located thereon.

The array of monolithic three-dimensional NAND strings can comprise a plurality of semiconductor channels. At least one end portion of each of the plurality of semiconductor channels extends substantially perpendicular to a top surface of the semiconductor substrate. The array of monolithic three-dimensional NAND strings can comprise a plurality of charge storage elements. Each charge storage element can be located adjacent to a respective one of the plurality of semiconductor channels, e.g., within a memory film 50. Each NAND string can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

FIG. 14A is an electron microscope image of an exemplary device according to an embodiment of the present disclosure. FIGS. 14B and 14C are close up electron microscope images of regions 98 and 99 in FIG. 14A, respectively. Thus, electrically conductive layers for control gate electrodes and select gate electrodes 46 of a vertical memory device can be vertically spaced by cavities 37 (as shown in region 98) to reduce capacitive coupling between neighboring electrically conductive gate electrodes. The backside spacer 74 (as shown in region 99) completely seals off the cavities 37. Thus, the encapsulated cavities 37 may be formed from the backside through the trenches 79 rather than memory openings without affecting the fabrication of the memory stacks 55 in the memory openings, which increases the simplicity of the fabrication method and improves the quality of the layers of the memory stacks 55.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a device, comprising:
   forming a stack of alternating layers comprising first material layers and second material layers over a substrate;
   forming a plurality of memory stack structures through the stack of alternating layers;
   forming a trench through the stack of alternating layers;
   replacing the second material layers with electrically conductive materials to form electrically conductive layers;
   removing the first material layers selective to the electrically conductive layers;
   depositing a dielectric material employing an anisotropic atomic layer deposition process in which supply of an active reactant gas species is spatially limited over a sidewall of the trench and first portions of the horizontal surfaces of the electrically conductive layers that are proximal to the trench to form a contiguous dielectric material layer while not depositing the dielectric material over second portions of the horizontal surfaces of the electrically conductive layers that are more distal from the trench than the first portions;
   forming an insulating spacer in the trench by anisotropically etching the contiguous dielectric material layer; and
   forming a backside contact via structure within the insulating spacer.

2. The method of claim 1, wherein removing the first material layers selective to the electrically conductive layers physically exposes horizontal surfaces of the electrically conductive layers.

3. The method of claim 1, wherein:
   the anisotropic atomic layer deposition is a plasma assisted atomic layer deposition using a silicon containing precursor; and
   the dielectric material is silicon oxide.

4. The method of claim 3, wherein the silicon containing precursor comprises bis(diethylamino)silane.

5. The method of claim 1, wherein a thickness of the dielectric material over each first portion of the horizontal surface decreases with a lateral distance from a periphery of the trench.

6. The method of claim 1, wherein:
   lateral cavities adjoined to a vertically extending cavity in the trench are formed in volumes from which the first material layers are removed; and
   deposition of the dielectric material forms encapsulated cavities in portions of the lateral recesses at each level between vertically neighboring pairs of electrically conductive layers.

7. The method of claim 6, wherein at least one of the encapsulated cavities has a first boundary that comprises a portion of planar sidewall surfaces of the plurality of memory stack structures, a set of second and third boundary surfaces comprising portions of planar horizontal surfaces of a vertically neighboring pair of electrically conductive layers and a fourth boundary that comprises a non-planar sidewall of the insulating spacer.

8. The method of claim 7, wherein:
   the fourth boundary comprises the non-planar sidewall of a respective protruding portion of the insulating spacer that protrudes outward from a vertical plane including sidewalls of the electrically conductive layers; and
   the non-planar sidewall of the respective protruding portion comprises a pair of slanted surfaces adjoined at a horizontal trough.

9. The method of claim 1, wherein the second material layers are replaced with the electrically conductive layers by:
   forming backside recesses by removing the second material layers selective to the first material layers and the plurality of memory stack structures;
   depositing a conductive material in the backside recesses and in a peripheral portion of the trench; and
   removing a portion of the deposited conductive material from the trench, wherein remaining portions of the deposited conductive material in the backside recesses constitute the electrically conductive layers.

10. The method of claim 1, wherein:
    the electrically conductive layers comprise control gate electrodes and select gate electrodes; and
    forming the plurality of memory stack structures comprises:
    forming a plurality of memory openings through the stack; and
    forming, within each memory opening, a memory film comprising a blocking dielectric, a charge storage region and a tunnel dielectric, and a semiconductor channel.

11. The method of claim 10, further comprising:
    forming a drain region on each top portion of the semiconductor channels; and
    forming a source region within a portion of the substrate that underlies the trench, wherein a horizontal semiconductor channel is disposed between the source region and the semiconductor channels.

12. The method of claim 10, wherein the first material layers and the second material layers comprise a pair of different materials selected from silicon oxide, silicon nitride, an amorphous or polycrystalline semiconductor material, or a carbon material.

13. The method of claim 1, wherein:
    the device is a vertical NAND memory device;
    the substrate comprises a silicon substrate;
    the NAND memory device comprises an array of monolithic three-dimensional NAND strings over the silicon substrate;

at least one memory cell in the first device level of the three-dimensional array of NAND strings is located over another memory cell in the second device level of the three-dimensional array of NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the semiconductor substrate;

a plurality of a memory films containing charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

14. A method of manufacturing a device, comprising:

forming a stack of alternating layers comprising first material layers and second material layers over a substrate;

forming a plurality of memory stack structures through the stack of alternating layers;

forming a trench through the stack of alternating layers;

replacing the second material layers with electrically conductive materials to form electrically conductive layers;

removing the first material layers selective to the electrically conductive layers to physically expose horizontal surfaces of the electrically conductive layers;

depositing a dielectric material over a sidewall of the trench and first portions of the horizontal surfaces of the electrically conductive layers that are proximal to the trench to form a contiguous dielectric material layer while not depositing the dielectric material over second portions of the horizontal surfaces of the electrically conductive layers that are more distal from the trench than the first portions;

forming an insulating spacer in the trench by anisotropically etching the contiguous dielectric material layer; and forming a backside contact via structure within the insulating spacer.

\* \* \* \* \*